United States Patent
Ota et al.

(10) Patent No.: US 11,670,523 B2
(45) Date of Patent: Jun. 6, 2023

(54) SUBSTRATE PROCESSING APPARATUS

(71) Applicant: SCREEN Holdings Co., Ltd., Kyoto (JP)

(72) Inventors: Takashi Ota, Kyoto (JP); Tomoaki Aihara, Kyoto (JP); Masayuki Hayashi, Kyoto (JP); Jiro Okuda, Kyoto (JP); Kunio Yamada, Kyoto (JP)

(73) Assignee: SCREEN Holdings Co., Ltd.

( * ) Notice: Subject to any disclaimer, the term of this patent is extended or adjusted under 35 U.S.C. 154(b) by 112 days.

(21) Appl. No.: 15/982,554

(22) Filed: May 17, 2018

(65) Prior Publication Data

US 2018/0337068 A1 Nov. 22, 2018

(30) Foreign Application Priority Data

May 18, 2017 (JP) .............................. JP2017-099269

(51) Int. Cl.
*H01L 21/67* (2006.01)
(52) U.S. Cl.
CPC .... *H01L 21/6708* (2013.01); *H01L 21/67167* (2013.01); *H01L 21/67017* (2013.01);
(Continued)
(58) Field of Classification Search
CPC ......... H01L 21/67023; H01L 21/67063; H01L 21/67075; H01L 21/6708; H01L 21/6715;
(Continued)

(56) References Cited

U.S. PATENT DOCUMENTS 5,571,560 A * 11/1996 Lin ....................... B05C 5/0208
118/305
5,962,070 A * 10/1999 Mitsuhashi ......... H01L 21/6715
118/320

(Continued)

FOREIGN PATENT DOCUMENTS

CN 101136320 A 3/2008
CN 105895554 A 8/2016
(Continued)

*Primary Examiner* — Benjamin Kendall
*Assistant Examiner* — Kurt Sweely
(74) *Attorney, Agent, or Firm* — Ostrolenk Faber LLP

(57) ABSTRACT

A substrate processing apparatus includes a substrate holder, a processing liquid supplying unit with a liquid nozzle discharging a processing liquid to an upper surface of the substrate. A moving unit moves the supplying unit between a process position at which the liquid nozzle faces the upper surface of the substrate and a retreat position. The supplying unit includes a first flow path in the processing liquid nozzle. The first flow path has one end part and the other end part that face a central region of the substrate and a peripheral region of the substrate, respectively, in a state where the supplying unit is positioned at the process position. It has a second flow path that supplies the processing liquid to the one end part, and a plurality of discharge ports in the processing liquid nozzle that are arranged along the first flow path direction and discharge the processing liquid in the first flow path to the substrate's upper surface.

12 Claims, 12 Drawing Sheets

(52) U.S. Cl.
CPC .. *H01L 21/67051* (2013.01); *H01L 21/67155* (2013.01); *H01L 21/67248* (2013.01)

(58) Field of Classification Search
CPC ......... H01L 21/67155; H01L 21/67161; H01L 21/67167; H01L 21/6719; H01L 21/67207; H01L 21/67017–67086; H01L 21/67051; H01L 21/67086; H01L 21/67173; H01L 21/67248; B05D 3/12
See application file for complete search history.

(56) References Cited

U.S. PATENT DOCUMENTS

| | | | | |
|---|---|---|---|---|
| 6,382,849 | B1* | 5/2002 | Sakamoto | G03D 5/00 430/311 |
| 7,241,342 | B2* | 7/2007 | Nguyen | H01L 21/6715 118/300 |
| 2003/0141314 | A1* | 7/2003 | Goto | B05B 7/1666 221/135 |
| 2003/0186560 | A1* | 10/2003 | Hasebe | C23C 16/45578 438/778 |
| 2004/0115567 | A1* | 6/2004 | Mandal | H01L 21/6715 430/324 |
| 2004/0222323 | A1* | 11/2004 | Akasaka | B41J 3/407 239/565 |
| 2008/0053488 | A1 | 3/2008 | Uchida | 134/32 |
| 2010/0029088 | A1 | 2/2010 | Mayer et al. | 438/748 |
| 2010/0130022 | A1 | 5/2010 | Park et al. | 438/758 |
| 2011/0159701 | A1 | 6/2011 | Nakashima et al. | 438/758 |
| 2012/0164572 | A1 | 6/2012 | Miyata et al. | 430/270.1 |
| 2013/0319470 | A1 | 12/2013 | Kai et al. | 134/22.12 |
| 2014/0261572 | A1 | 9/2014 | Sotoku et al. | 134/33 |
| 2015/0075571 | A1 | 3/2015 | Miura | 134/99.1 |
| 2015/0099355 | A1 | 4/2015 | Inatomi et al. | 438/597 |
| 2015/0114432 | A1* | 4/2015 | Iwata | B08B 3/02 134/19 |
| 2015/0114560 | A1 | 4/2015 | Inoue | |
| 2016/0240401 | A1 | 8/2016 | Muramoto et al. | |
| 2016/0372341 | A1 | 12/2016 | Kobayashi et al. | |
| 2018/0272371 | A1 | 9/2018 | Terada et al. | |

FOREIGN PATENT DOCUMENTS

| | | |
|---|---|---|
| JP | H07-245287 A | 9/1995 |
| JP | 8-279484 A | 10/1996 |
| JP | H11-156278 A | 6/1999 |
| JP | H11-226476 A | 8/1999 |
| JP | 2001-234399 A | 8/2001 |
| JP | 2004-186357 A | 7/2004 |
| JP | 2009-231620 A | 10/2009 |
| JP | 2012-164896 A | 8/2012 |
| JP | 2013-149942 A | 8/2013 |
| JP | 2015-084380 A | 4/2015 |
| JP | 2015-115492 A | 6/2015 |
| JP | 2017-011033 A | 1/2017 |
| KR | 10-2005-0105166 A | 11/2005 |
| TW | 201027279 | 7/2010 |
| TW | 201138981 A1 | 11/2011 |
| TW | 201351534 A | 12/2013 |
| TW | 201402872 A | 1/2014 |
| TW | 201410338 A | 3/2014 |
| TW | 201448017 A | 12/2014 |
| WO | WO 2016/147440 A1 | 9/2016 |

\* cited by examiner

SUBSTRATE PROCESSING APPARATUS

BACKGROUND OF THE INVENTION

1. Field of the Invention

The present invention relates to a substrate processing apparatus for processing a substrate. Examples of substrates to be processed include semiconductor wafers, substrates for liquid crystal displays, substrates for FPD (Flat Panel Display) for organic EL (Electroluminescence) display device, substrates for optical disks, substrates for magnetic disks, substrates for magneto-optical disks, substrates for photomasks, ceramic substrates, substrates for solar cells, etc.

2. Description of the Related Art

In Japanese Patent Application Publication No. 2015-115492, a substrate processing apparatus, which can perform a substrate processing for processing an upper surface of a substrate with a chemical liquid, is disclosed. This substrate processing apparatus has a chemical liquid discharge head in which a plurality of discharge ports discharging the chemical liquid are formed. The chemical liquid discharge head is attached to an arm, and the arm is combined with a support shaft. As the support shaft is swung around a vertical axis by swing drive mechanism, the chemical discharge head moves between a position which is right above a rotational center of the substrate (a first position shown in FIG. 7 of Japanese Patent Application Publication No. 2015-115492), and a position which is right above a part of a periphery of the substrate (a second position shown in FIG. 8 of Japanese Patent Application Publication No. 2015-115492). The chemical liquid is supplied to the chemical liquid discharge head from the inside of the arm.

SUMMARY OF THE INVENTION

In a nozzle in which a plurality of discharge ports are arranged in a direction in which a flow path extends, like the chemical liquid discharge head which is shown in FIG. 2 of Japanese Patent Application Publication No. 2015-115492, a flow rate (an amount of the flowing) of a liquid discharged from a discharge port which is located near a tip end of the flow path (at a position far from the arm) tends to be larger than a flow rate of a liquid discharged from a discharge port which is located near a base end of the flow path (at a position close to the arm).

A distance that a discharge port facing a peripheral of the substrate relatively moves per unit time in a rotational direction of the substrate is larger than a distance that a discharge port facing a central region of the substrate relatively moves per unit time in a rotational direction of the substrate. Therefore, unless the flow rate of the chemical liquid, which is supplied to the peripheral region of the substrate, is made larger than the flow rate of the chemical liquid, which is supplied to the central region of the substrate, the processing in the central region of the substrate advances more than the processing in the peripheral of the substrate. Consequently, the upper surface of the substrate may not be processed evenly.

As shown in FIG. 7 of Japanese Patent Application Publication No. 2015-115492, when a center of the chemical liquid discharge head is positioned above the rotational center and the chemical liquid is discharged to the upper surface of the substrate from the chemical liquid discharge head, the flow rate of the chemical liquid supplied to the peripheral region of the substrate cannot be made larger than the flow rate of the substrate from the chemical liquid supplied the central region of the substrate. Thereby, when the chemical liquid discharge head is used, the upper surface of the substrate may not be processed evenly.

Also, in a general chemical liquid discharge head which is not provided with a configuration which heats the chemical liquid discharge head, the temperature of the arm and the chemical liquid discharge head is about the same temperature as the surrounding temperature (about room temperature), so that the chemical liquid is thereby cooled inside the armor the chemical liquid discharge head. Therefore, even though the sufficiently heated chemical liquid is supplied to the chemical liquid discharge head, the temperature of the chemical liquid may decrease until the chemical liquid is discharged from discharge ports.

Therefore, one object of the present invention is to provide a substrate processing apparatus which can process an upper surface of a substrate with a desired high temperature processing liquid and can reduce processing unevenness on the upper surface of the substrate.

The one preferred embodiment of the present invention provides a substrate processing apparatus includes a substrate holding unit which holds a substrate horizontally, a processing liquid supplying unit which has a processing liquid nozzle discharging a processing liquid and supplies the processing liquid to an upper surface of the substrate, and a moving unit which moves the processing liquid supplying unit between a process position at which the processing liquid nozzle faces the upper surface of the substrate and a retreat position at which the processing liquid nozzle retreats from positions at which the processing liquid nozzle faces the upper surface of the substrate. Furthermore, the processing liquid supplying unit includes a first flow path which is formed in the processing liquid nozzle, the first flow path having one end part and the other end part that face a central region of the substrate and a peripheral region of the substrate, respectively, in a state where the processing liquid supplying unit is positioned at the process position, a second flow path which extends as turning back from the one end part and supplies the processing liquid to the one end part, and a plurality of discharge ports which are formed in the processing liquid nozzle, are arranged along a direction in which the first flow path extends, and discharge the processing liquid in the first flow path to the upper surface of the substrate.

According to this configuration, the processing liquid is supplied from the second flow path to the one end part of the first flow path. Furthermore, the plurality of the discharge ports are arranged along the direction in which the first flow path extends. Therefore, in the processing liquid nozzle, a flow rate discharged from discharge ports which are positioned near a tip end (the other part) of the first flow path is larger than a flow rate discharged from discharge ports which are positioned near a base end (the one part) of the first flow path. Therefore, in the processing liquid nozzle, the flow rate of the discharge ports on the other end part side of the first flow path is larger than the flow rate of the discharge ports on the one end part side of the first flow path. In a state where the processing liquid supplying unit is positioned at the process position, the one end part of the first flow path faces the central region of the substrate and the other end part of the first flow path faces the peripheral region of the substrate. Therefore, a flow rate of the processing liquid which is supplied to the peripheral region of the upper side of the substrate can be increased more than a flow rate of the processing liquid which is supplied to the central region. Processing unevenness on the upper surface of the substrate can thus be reduced.

Furthermore, the second flow path which supplies the processing liquid to the one end part of the first flow path extends as turning back from the one end part, so that the first flow path and the second flow path can be arranged adjacent each other. Furthermore, the whole of the processing liquid supplying unit is moved by the moving unit, so that a state, where the first flow path and the second flow path are adjacent to each other, is maintained during the movement of the processing liquid supplying unit. Therefore, the processing liquid in the first flow path can be kept warm by the processing liquid in the second flow path. Lowering of the temperature of the processing liquid heading to the discharge ports can thus be suppressed. As a result, the temperature of the processing liquid which is discharged from the discharge ports and lands on the upper surface of the substrate can be maintained at a high temperature, so that the upper surface of the substrate can be processed with the processing liquid at the desired high temperature.

As described above, it is possible to process the upper surface of a substrate with the processing liquid at the desired high temperature and reduce processing unevenness on the upper surface of the substrate.

In one preferred embodiment of the present invention, the first flow path extends in parallel with the upper surface of the substrate. Therefore, the difference in the distance which is between the discharge port and the substrate, between the plurality of the discharge ports can be reduced. The difference, in heat lost from the processing liquid from the time when the processing liquid is discharged from the discharge port to the time when the processing liquid lands on the surface of the substrate, between the plurality of the discharge ports can thus be reduced. As a result, processing unevenness on the upper surface of the substrate can be reduced.

In one preferred embodiment of the present invention, the second flow path extends in parallel with the first flow path. Therefore, the first flow path and the second flow path can be brought close to each other in the entire region in the direction in which the first flow path extends. As a result, the processing liquid in the first flow path is effectively kept warm by the processing liquid in the second flow path. Furthermore, the first flow path and the second flow path extend in parallel, so that the processing liquid in the first flow path evenly kept warm in the entire region in their extending direction. In other words, occurrence of a state, where the processing liquid in the first flow path is not partially kept warm, can be prevented. Therefore, the difference in the temperature of the processing liquid which is discharged from the discharge ports, between the plurality of the discharge ports can be reduced. Uneven processing on the upper surface of the substrate can thus be reduced.

In one preferred embodiment of the present invention, the processing liquid supplying unit further includes a flow path forming pipe in which the second flow path is formed. The flow path forming pipe is fixed with the processing liquid nozzle. That is, the flow path forming pipe in which the second flow path is formed also serves a member which supports the processing liquid nozzle. Miniaturization of the processing liquid supplying unit can thus be achieved.

In one preferred embodiment of the present invention, the second flow path is formed in the processing liquid nozzle. Therefore, the second flow path can be placed at a position even closer to the first flow path. As a result, the processing liquid in the first flow path is more effectively kept warm by the processing liquid in the second flow path.

In one preferred embodiment of the present invention, the processing liquid nozzle includes a double tube structure which is configured of an inner tube and an outer tube. Also, the first flow path is defined by the inner tube, and the second flow path is defined by the inner tube and the outer tube. Therefore, the second flow path can be placed at a position even closer to the first flow path. As a result, the processing liquid in the first flow path is more effectively kept warm by the processing liquid in the second flow path.

In one preferred embodiment of the present invention, the moving unit includes a pivoting unit which turns the processing liquid supplying unit around a pivoting axis along a vertical direction. Therefore, the processing liquid supplying unit can be moved between the process position and the retreat position by a simple motion of turning around the pivoting axis.

In one preferred embodiment of the present invention, the plurality of the discharge ports are provided, such that a flow rate of the processing liquid, which is supplied to a region facing the vicinity of the other end part of the first flow path in the upper surface of the substrate, is larger than a flow rate of the processing liquid which is supplied to a region facing the vicinity of the one end part of the first flow path in the upper surface of the substrate. As previously described, in the state where the processing liquid supplying unit is positioned at the process position, the one end part of the first flow path faces the central region of the substrate and the other end part of the first flow path faces the peripheral region of the substrate. Therefore, the flow rate of the processing liquid which is supplied to the peripheral region of the upper surface of the substrate can be made even larger than the flow rate of the processing liquid which is supplied to the central region of the upper surface of the substrate. As a result, a reduction in the temperature of the processing liquid at the peripheral region of the upper surface of the substrate can be suppressed, so that a reduction in an etching rate at the peripheral region of the upper surface of the substrate can be prevented.

In one preferred embodiment of the present invention, the substrate processing apparatus further includes an suction unit which sucks the processing unit in the first flow path.

The processing liquid may remain in the first flow path in which the plurality of the discharge ports are formed, when the supply of the processing liquid from the second flow path to the first flow path is stopped. The processing liquid which remains in the first flow path may fall as droplets, when the moving unit moves the processing liquid supplying unit in a state where the processing liquid remains in the first flow path. Particles may occur at the upper surface of the substrate due to such unintentional fall of the processing liquid. Therefore, by letting the suction unit scuk the processing liquid in the first flow path, it is possible to prevent the processing liquid from remaining in the first flow path when the supply of the processing liquid is stopped. Falling of the processing liquid to the substrate can thus be suppressed when supply of the processing liquid is stopped.

In one preferred embodiment of the present invention, the suction unit includes an suction flow path which is connected to the vicinity of the one end of the first flow path, and an suction device which sucks the inside of the first flow path via the suction flow path. Therefore, the suction device can effectively suck the processing liquid in the first flow. On the other hand, it is possible to prevent the processing liquid in the second flow path from being sucked more than necessary. Therefore, it is possible to prevent the processing liquid from being wasted by sucking the processing liquid more than necessary, and the processing liquid in the first flow path can be removed efficiently.

In one preferred embodiment of the present invention, the first flow path includes a liquid storing part which stores the processing liquid which is supplied from the second flow path, and a discharge flow path which extends laterally from the liquid storing part and is connected to each of the discharge ports and the liquid storing part.

According to this configuration, when the supply of the processing liquid from the second flow path to the first flow path, the processing liquid may remain in the liquid storing part and the discharge flow path. The discharge flow path extends laterally from the liquid storing part, so that the processing liquid in the discharge flow path hardly bears the weight of the processing liquid in the liquid storing part. The falling of the processing liquid from the discharge flow path via the discharge port to the substrate can thus be suppressed, when the supply of the processing liquid stops.

In one preferred embodiment of the present invention, the discharge flow path includes a vertical flow path which extends upwardly from the discharge port, and an inclined flow path which connects the vertical flow path and the liquid storing part and is inclined with respect to a horizontal direction as the inclined flow path goes upwardly from the liquid storing part to the vertical flow path. Therefore, even though the processing liquid remains in the discharge flow path, the processing liquid is easy to return to the liquid storing part via the inclined flow path. The weight, which the processing liquid in the discharge flow path bears, can thus be further reduced.

In one preferred embodiment of the present invention, the discharge port is positioned higher than a bottom part of the liquid storing part. Therefore, compared to a configuration in which the discharge port is located lower than the liquid storing part, the discharge flow path can be shorten. As a result, the weight which the processing liquid in the discharge flow path bears can thus be further reduced.

In one preferred embodiment of the present invention, a flow path cross-sectional area of the discharge flow path is smaller than a flow path cross-sectional area of the liquid storing part. Therefore, a surface tension, which acts on the processing liquid in the discharge flow path, can be increased, so that the processing liquid is easy to remain in the discharge flow path. Falling of the processing liquid to the substrate can thus be suppressed, when the supply of the processing liquid is stopped.

In one preferred embodiment of the present invention, the processing liquid supplying unit includes a heat insulating member which surrounds the processing liquid nozzle and insulates the processing liquid nozzle from atmosphere around the processing liquid nozzle. Therefore, the temperature of the processing liquid in the first flow path can be further maintained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
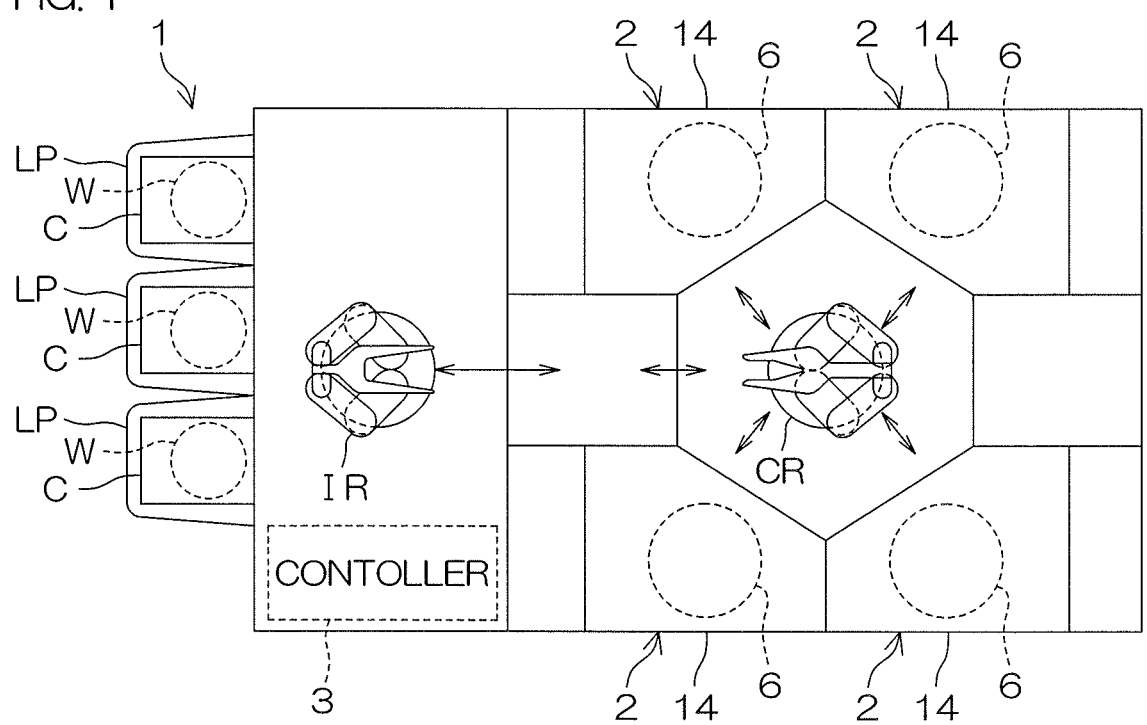
FIG. 1 is a schematic plan view for explaining a layout of the interior of a substrate processing apparatus according to a first preferred embodiment of the present invention.

FIG. 1 is a schematic plan view for explaining a layout of the interior of a substrate processing apparatus 1 according to a first preferred embodiment of the present invention.

The substrate processing apparatus 1 is a single substrate processing type apparatus that processes a substrate W, such as a silicon wafer, one by one. In the present preferred embodiment, the substrate W is a circular substrate. The substrate processing apparatus 1 includes a plurality of processing units 2 each of which processes the substrate W by use of a processing liquid such as a chemical liquid, a rinse liquid and the like, a plurality of load ports LP each of which holds a carrier C that houses a plurality of the substrates W to be processed by the processing units 2, transfer robots IR and CR that transfer the substrates W between the load ports LP and the processing units 2, and a controller 3 that controls the substrate processing apparatus 1. The transfer robot IR transfers the substrate W between the carriers C and the transfer robot CR. The transfer robot CR transfers the substrate W between the transfer robot IR and the processing units 2. The plurality of processing units 2 have, for example, the same configuration.

Figure 2:
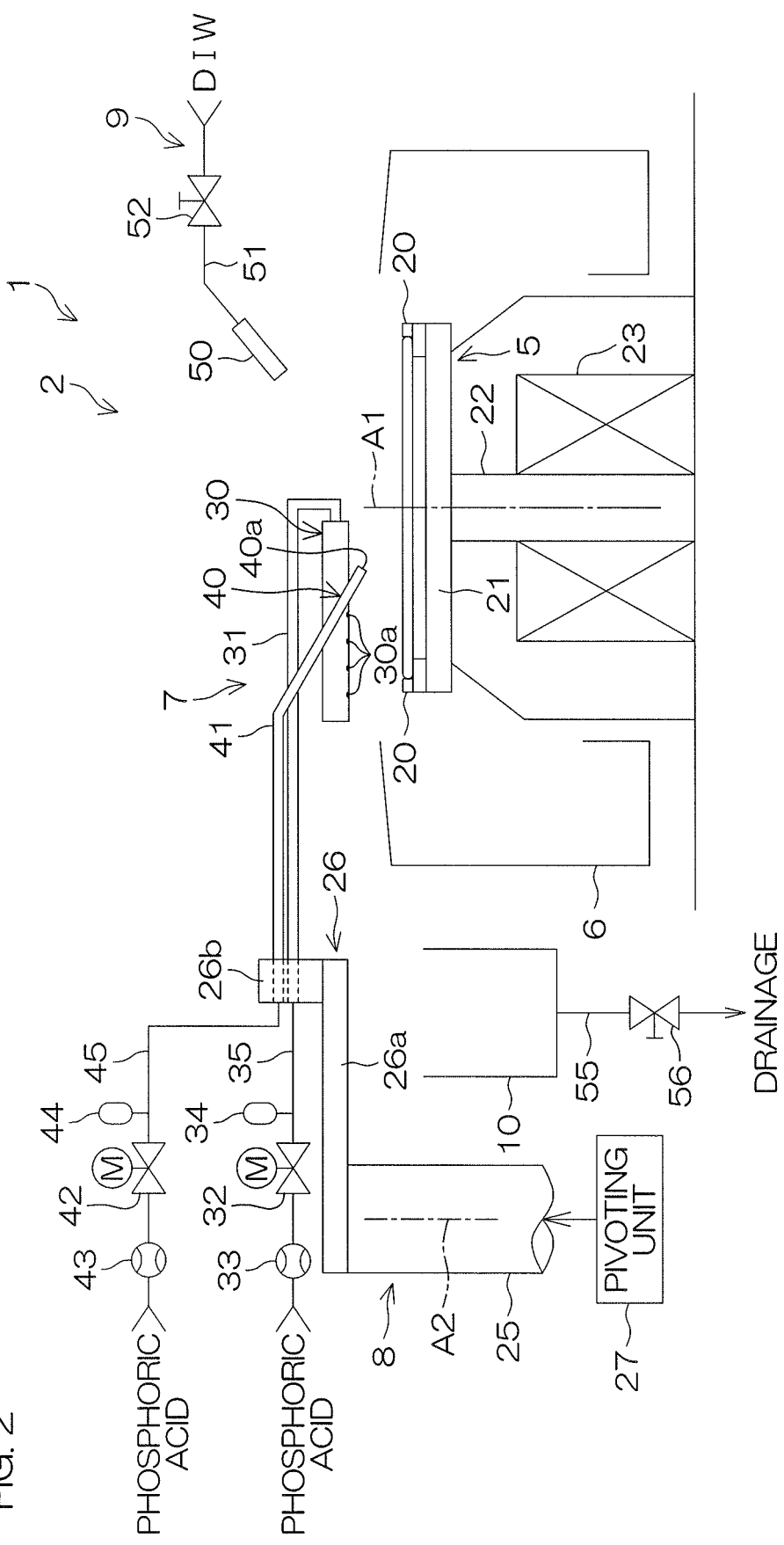
FIG. 2 is a schematic view of a substrate processing unit included in the substrate processing apparatus.

FIG. 2 is a schematic view to explain a configuration example of a processing unit 2.

The processing unit 2 includes a spin chuck 5, a cylindrical cup 6, a chemical liquid supplying unit 7, a moving unit 8, a rinse liquid supplying unit 9 and a standby pot 10. The spin chuck 5 rotates one substrate W around a vertical rotational axis A1 passing through a central portion of the substrate while holding the substrate W in a horizontal attitude. The cup 6 surrounds the spin chuck 5. The chemical liquid supplying unit 7 supplies a chemical liquid to an upper surface (a front surface) of the substrate W. The moving unit 8 moves the chemical liquid supplying unit 7 at least in a horizontal direction. The rinse liquid supplying unit 9 supplies a rinse liquid such as deionized water (DIW) to the upper surface of the substrate W. In plan view, the standby pot 10 is located around the cup 6.

The processing unit 2 further includes a chamber 14 (see FIG. 1) which houses the cup 6. A carry-in/carry-out port (not shown) that carries in/out the substrate W is formed in the chamber 14. The chamber 14 is provided with a shutter unit that opens and closes the carry-in/carry-out port.

The spin chuck 5 includes chuck pins 20, a spin base 21, a rotational shaft 22 which is joined to the center of a lower surface of the spin base 21, and an electric motor 23 which gives a driving force to the rotational shaft 22. The rotational shaft 22 extends in a vertical direction along the rotational axis A1. The spin base 21 is jointed to an upper end of the rotational shaft 22.

The spin base 21 has a disk shape along the horizontal direction. The plurality of the chuck pins 20 are arranged at intervals in a circumferential direction at a peripheral edge of an upper surface of the spin base 21. The spin base 21 and the chuck pins 20 are included in a substrate holding unit which holds the substrate W horizontally. The substrate holding unit is also called a substrate holder.

The rotational shaft 22 is rotated by the electric motor 23, so that the substrate W is rotated around the rotational axis A1. The electric motor 23 is included in a substrate rotating unit which rotates the substrate W around the rotational axis A1.

The chemical liquid supplying unit 7 includes a first chemical liquid nozzle 30 which discharges the chemical liquid, a first chemical liquid pipe 31 which supports the first chemical liquid nozzle 30, a second chemical liquid nozzle 40 which discharges the chemical liquid, and a second chemical liquid pipe 41 which supports the second chemical liquid nozzle 40. The first chemical liquid nozzle 30 has a plurality of first discharge ports 30*a* which discharge the chemical liquid to the upper surface of the substrate W. The second chemical liquid nozzle 40 includes a second discharge port 40*a* which discharges the chemical liquid to the upper surface of the substrate W. The chemical liquid supplying unit 7 is an example of a processing liquid nozzle which supplies the processing liquid to the upper surface of the substrate W. The first chemical liquid nozzle 30 is an example of a processing liquid nozzle which is included in the processing liquid supplying unit.

The chemical liquid is, for example, phosphoric acid that is an example of an etching liquid. The chemical liquid may be a liquid other than phosphoric acid. That is, the chemical liquid may be a liquid containing at least one of sulfuric acid, acetic acid, nitric acid, hydrochloric acid, hydrofluoric acid, phosphoric acid, aqueous ammonia, aqueous hydrogen peroxide, organic acid (For example citric acid, oxalic acid etc.), organic alkali (For example TMAH: tetramethylammonium hydroperoxide, etc.) a surfactant, and a corrosion inhibitor.

A first chemical liquid supplying pipe 35 is connected to the first chemical liquid nozzle 30 via the first chemical liquid pipe 31. A first electric valve 32, a first flowmeter 33 and a first temperature sensor 34 are interposed in the first chemical liquid supplying pipe 35. The chemical liquid such as phosphoric acid is supplied to the first chemical liquid supplying pipe 35 from a chemical liquid source. The first electric valve 32 switches the presence or absence of supply of the chemical liquid to the first chemical liquid nozzle 30 and changes the flow rate (the amount of the flowing) of the chemical liquid that is supplied to the first chemical liquid nozzle 30. The first flowmeter 33 detects the flow rate of the chemical liquid which flows in the first chemical liquid supplying pipe 35. The first temperature sensor 34 detects the temperature of the chemical liquid in the first chemical liquid supplying pipe 35.

A second chemical liquid supplying pipe 45 is connected to the second chemical liquid nozzle 40 via the second chemical liquid pipe 41. A second electric valve 42, a second flowmeter 43 and a second temperature sensor 44 are interposed in the second chemical liquid supplying pipe 45. The chemical liquid such as phosphoric acid is supplied to the second chemical liquid pipe 45 from the chemical liquid source. The second electric valve 42 switches the presence or absence of supply of the chemical liquid to the second chemical liquid nozzle 40 and changes the flow rate of the chemical liquid that is supplied to the second chemical liquid nozzle 40. The second flowmeter 43 detects the flow rate of the chemical liquid which flows in the second chemical liquid supplying pipe 45. The second temperature sensor 44 detects the temperature of the chemical liquid in the second chemical liquid supplying pipe 45.

The chemical liquid supplying unit 7 is moved between a process position and a retreat position by the moving unit 8. When the chemical liquid supplying unit 7 is positioned at the process position, the first chemical liquid nozzle 30 faces the substrate W. When the chemical liquid supplying unit 7 is positioned at the retreat position, the first chemical liquid nozzle 30 retreats from the position facing the substrate W. Ina state where the chemical liquid supplying unit 7 is positioned at the process position, the second chemical liquid nozzle 40 as well as the first chemical liquid nozzle 30 faces the substrate W. In a state where the chemical liquid supplying unit 7 is positioned at the retreat position, the second chemical liquid nozzle 40 also retreat from the position facing the substrate W.

The moving unit 8 includes a pivoting shaft 25 which extends in the vertical direction, a holder 26 which is connected to the pivoting shaft 25, and a pivoting unit 27 which gives a driving force around a pivoting axis A2 of the pivoting shaft 25 to the pivoting shaft 25. The holder 26 includes an arm 26*a* which extends in a direction orthogonal to the pivoting axis A2, a supporting part 26*b* which supports the first chemical liquid pipe 31 and the second chemical liquid pipe 41. Since the pivoting unit 27 turns the pivoting shaft 25, the holder 26, the first chemical liquid pipe 31 and the second chemical liquid pipe 41 turns around the pivoting axis A2. As a result, the first chemical liquid nozzle 30 and the second chemical liquid nozzle 40 turns around the pivoting axis A2. The pivoting unit 27 is, for example, a motor.

The moving unit 8 may include a ball screw (not shown) which raises/lowers the pivoting shaft 25, and an electric motor (not shown) which gives a driving force to the ball screw. Since the moving unit 8 raises/lowers the pivoting shaft 25, the holder 26, the first chemical liquid pipe 31 and the second chemical liquid pipe 41 are raised/lowered. As a result, the first chemical liquid nozzle 30 and the second chemical liquid nozzle 40 are raised/lowered.

The rinse liquid supplying unit 9 includes a rinse liquid nozzle 50 which supplies the rinse liquid to the upper surface of the substrate W. A rinse liquid pipe 51 is connected to the rinse liquid nozzle 50. A rinse liquid valve 52 is interposed in the rinse liquid pipe 51. The rinse liquid such as DIW is supplied to the rinse liquid pipe 51 from a rinse liquid source. The rinse liquid valve 52 opens/closes a flow path of the rinse liquid. The rinse liquid nozzle 50 is a fixed nozzle. Unlike this embodiment, the rinse liquid nozzle 50 may be a moving nozzle which can move in the horizontal direction and the vertical direction.

The rinse liquid is not limited to DIW, but may be carbonated water, electrolytic ionized water, ozone water, hydrochloric acid water of dilution concentration (for example, about 10 ppm to 100 ppm), alkali ionic water containing ammonia and the like, and reduced water (hydrogen water).

The standby pot 10 is a pot for receiving the chemical liquid which is discharged from the first chemical liquid nozzle 30 and the second chemical liquid nozzle 40 that retreat from the upper surface of the substrate W. The standby pot 10 has a cylindrical shape with a bottom. With the chemical liquid supplying unit 7 in the retreat position, the first chemical liquid nozzle 30 and the second chemical liquid nozzle 40 are located above the standby pot 10. A draining pipe 55 for draining the chemical liquid in the standby pot 10 is connected to a bottom part of the standby pot 10. A draining valve 56 which opens/closes the flow path of the chemical liquid in the draining pipe 55 is interposed in the draining pipe 55.

Next, the configuration of the chemical liquid supplying unit 7 will be described with reference to FIG. 3 to FIG. 6.

Figure 3:
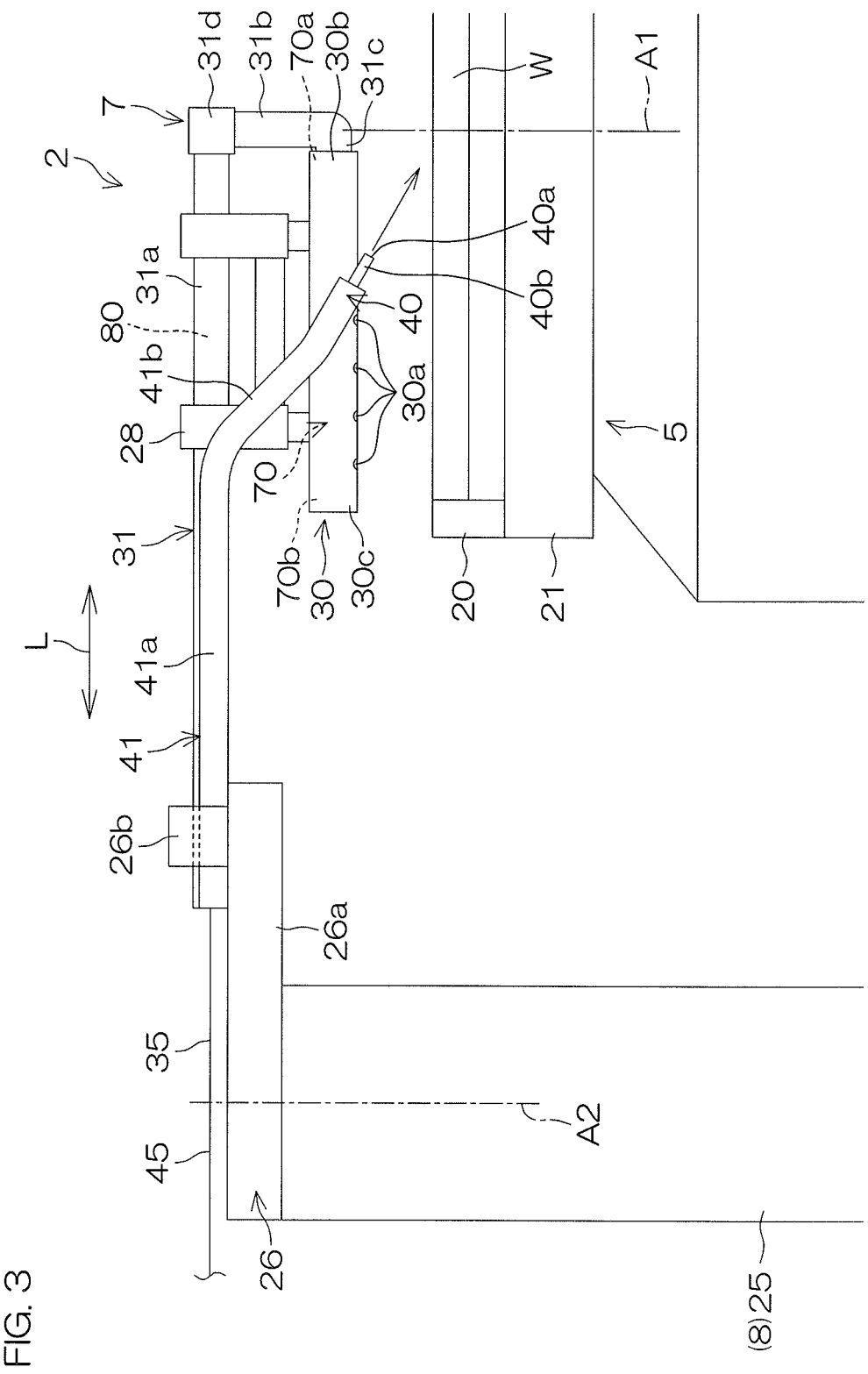
FIG. 3 is a side view of a processing liquid supplying unit included in the substrate processing unit and its surroundings.
Figure 4:
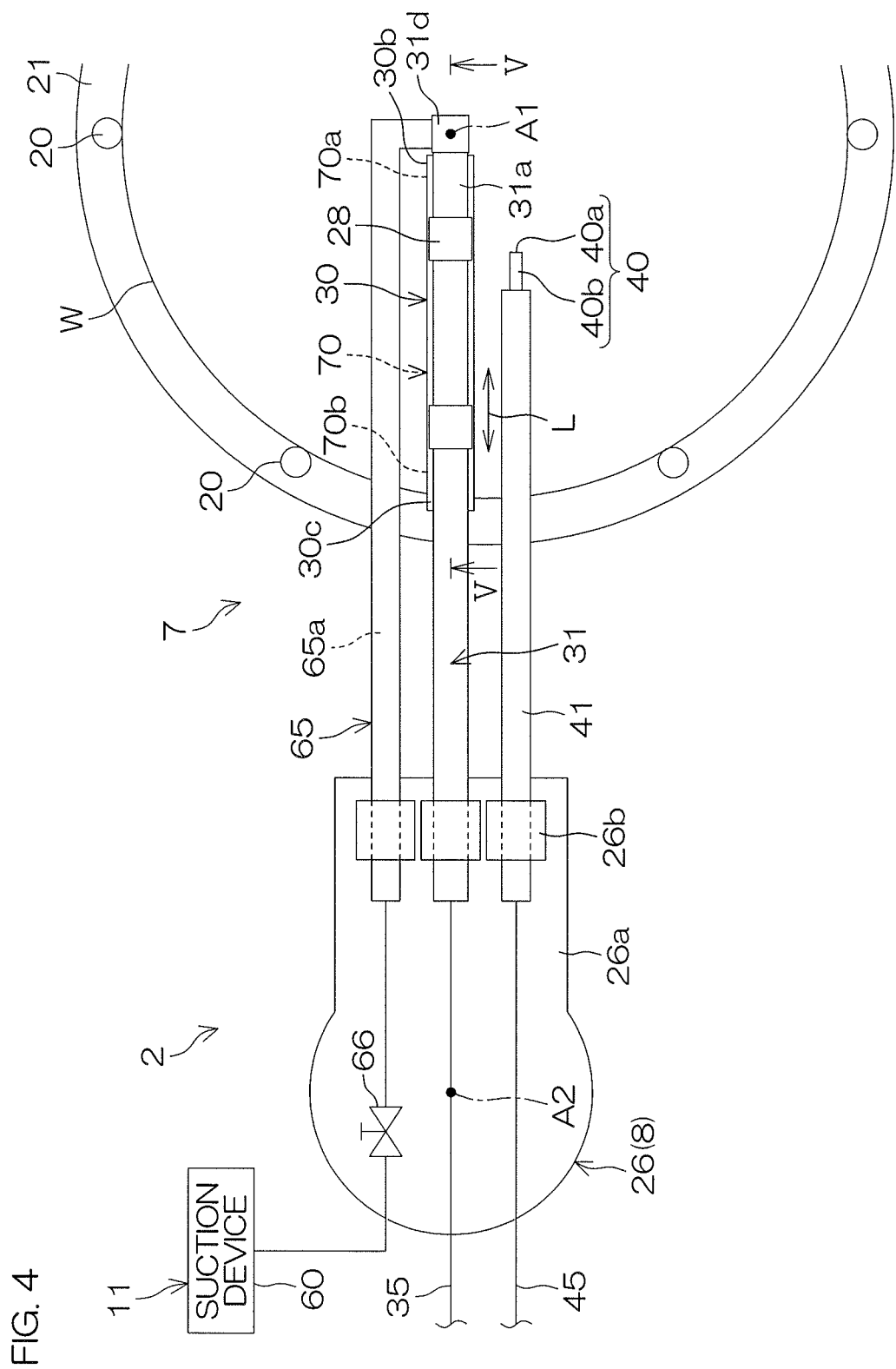
FIG. 4 is a plan view of the processing liquid supplying unit.
Figure 5:
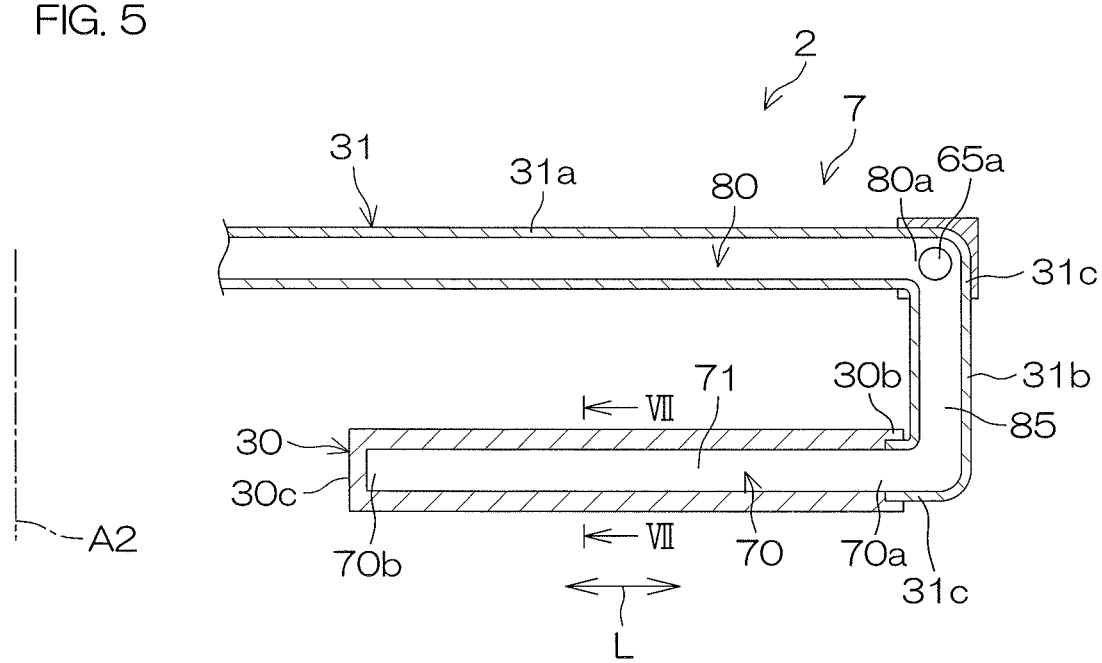
FIG. 5 is a cross-sectional view taken along the V-V line in FIG. 4.
Figure 6:
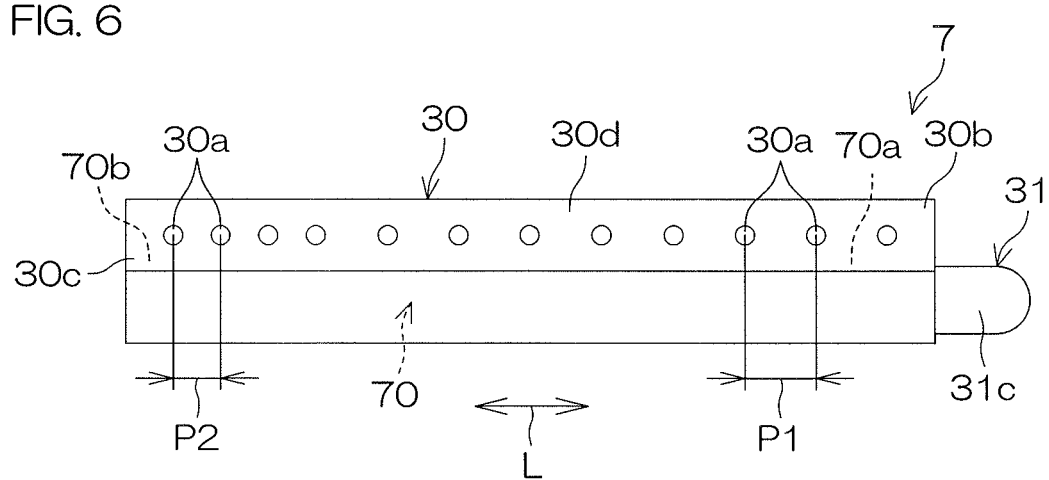
FIG. 6 is a bottom view of a processing liquid nozzle included in the processing liquid supplying unit and its surroundings.

FIG. 3 is a side view of the chemical liquid supplying unit 7 and its surroundings. FIG. 4 is a plan view of the chemical liquid supplying unit 7. FIG. 5 is a cross-sectional view taken along the V-V line in FIG. 4. FIG. 6 is a bottom view of the first chemical liquid nozzle 30 and its surroundings.

Referring to FIG. 3, the second chemical liquid pipe 41 includes a horizontal part 41*a* and a hanging part 41*b*. The horizontal part 41*a* extends in a direction away from the pivoting axis A2. The hanging part 41*b* is connected to the horizontal part 41*a*. The hanging part 41*b* extends obliquely with respect to the horizontal direction so as to be directed downwardly as going away from the pivoting axis A2. The second chemical liquid nozzle 40 has a discharge part 40*b*, in which a second discharge port 40*a* is formed, at its tip end.

The first chemical liquid nozzle 30 extends horizontally. The first chemical liquid nozzle 30 has one end part 30*b* on the opposite side of the pivoting axis A2 side, and the other end part 30*c* on the pivoting axis A2 side. The first chemical liquid pipe 31 extends turning back from the one end part of the first chemical liquid nozzle 30. The first chemical liquid pipe 31 includes an upper horizontal part 31*a*, a hanging part 31*b* and a lower horizontal part 31*c*. The upper horizontal part 31*a* extends in the direction away from the pivoting axis A2. The hanging part 31*b* extends downwardly from the upper horizontal part 31*a*. The lower horizontal part 31*c* extends horizontally from a lower end of the hanging part 31*b* in a direction approaching the pivoting axis A2. The upper horizontal part 31*a* and the lower horizontal part 31*c* extend in parallel with the first chemical liquid nozzle 30. The hanging part 31*b* extends in vertical direction. The lower horizontal part 31*c* is connected to the one end part 30*b* of the first chemical liquid nozzle 30.

The first chemical liquid nozzle 30 is fixed to the first chemical liquid pipe 31 via a bracket 28 which extends downwardly from the upper horizontal part 31*a* of the first chemical liquid pipe 31.

Referring to FIG. 4, the processing unit 2 further includes an suction unit 11 which sucks the chemical liquid in the first chemical liquid nozzle 30. The suction unit 11 includes an suction pipe 65 and an suction device 60. The suction pipe 65 is branched and connected to the first chemical liquid pipe 31. The suction device 60 sucks the inside of a first flow path 70 which is provided in the first chemical liquid nozzle 30 via an suction flow path 65*a* which is formed in the suction pipe 65. The suction device 60 is a vacuum pump etc. A suction valve 66 which opens/closes the suction flow path 65*a* is interposed in the suction pipe 65. The suction pipe 65 is connected to a connecting portion 31*d* between the upper horizontal part 31*a* and the hanging part 31*b* of the first chemical liquid pipe 31. The suction pipe 65 is supported, together with the first chemical liquid pipe 31 and the second chemical liquid pipe 41, by the supporting part 26*b* of the holder 26.

Referring to FIG. 5, the first flow path 70 which extends in the horizontal direction is formed in the first chemical liquid nozzle 30. The direction in which the first flow path 70 extends is the same direction as the direction in which the first chemical liquid nozzle 30 extends. The first flow path 70 extends in parallel with the upper surface of the substrate W. the direction in which the first flow path 70 extends is called a longitudinal direction L. The first flow path 70 has the one end part 70*a* on the other side of the pivoting axis A2 side, and the other end part 70*b* on the pivoting axis A2 side.

A second flow path 80 which extends as turning back from the one end part 70*a* of the first flow path 70 is formed in the first chemical liquid pipe 31. For details, the second flow path 80 is formed in the first chemical liquid pipe 31, and a turning back flow path 85 for connecting the one end part 70*a* of the first flow path 70 and the second flow path 80 is formed in the hanging part 31*b* and the lower horizontal part 31*c* of the first chemical liquid pipe 31. The first chemical liquid pipe 31 is one example of a flow path forming pipe in which the second flow path 80 is formed. The processing liquid flows from the one end part 70*a* side to the other end 70*b* side in the first flow path 70. The one end part 70*a* is upstream side of the other end part 70*b* in a direction of the processing liquid flow.

The second flow path 80 extends horizontally. The second flow path 80 extends in parallel with the first flow path 70, and is connected to the first flow path 70 via the folding back flow path 85. Therefore, the second flow path 80 is overlapped with the first flow path 70 in plan view. The suction flow path 65*a* is connected to a portion (a vicinity 80*a* of the one end part 70*a* of the first flow path 70) at which the second flow path 80 and the folding back flow path 85 intersect.

The first chemical liquid nozzle 30 faces the upper side of the substrate W, in a state where the chemical liquid supplying unit 7 is positioned at the process position (in the state shown in FIG. 3 and FIG. 4). For details, referring to FIG. 3, the one end part 30*b* of the first chemical liquid nozzle 30 faces a central region of the upper surface of the substrate, and the other end part of 30*c* of the first chemical liquid nozzle 30 faces a peripheral region of the upper surface of the substrate W. Therefore, in the state where the chemical liquid supplying unit 7 is positioned at the process position, the first flow path 70 is located above the substrate W. Also, the one end part 70a of the first flow path 70 faces the central region of the upper surface of the substrate W, and the other end part 70b of the first flow path 70 faces the peripheral region of the upper surface of the substrate W.

The central region of the upper surface of the substrate W is a region that includes a rotational center of the upper surface of the substrate W. The rotational center of the upper surface of the substrate W is a position which intersects with the rotational axis A1 on the upper surface of the substrate W. The peripheral region of the upper surface of the substrate W is a region near the periphery of the upper surface of the substrate W.

As shown in FIG. 6, the plurality of the first discharge ports 30a is formed in the lower surface 30d of the first chemical liquid nozzle 30. The plurality of discharge ports 30a are arranged along the longitudinal direction L. For details, the plurality of discharge ports 30a are equally spaced from each other. When the chemical liquid supplying unit 7 is located at the process position, the first discharge port 30a near the one end part 70a discharges the chemical liquid in the first flow path 70 to the central region of the upper surface of the substrate W, the first discharge port 30a near the other end part 70b discharges the chemical liquid in the first flow path 70 to the peripheral region of the upper surface of the substrate W.

A distance (a second pitch P2) between the first discharge ports 30a near the other end part 70b of the first flow path 70 is smaller than a distance (a first pitch P1) between the first discharge ports 30a near the one end part 70a of the first flow path 70. That is, the plurality of the first discharge ports 30a are configured such that the flow rate of the chemical liquid which is supplied to the region (the peripheral region of the upper surface of the substrate W), which faces the vicinity of the other end part 70b of the first flow path 70, on the upper surface of the substrate W, is larger than the flow rate of the chemical liquid which is supplied to the region (the central region of the upper surface of the substrate W), which faces the vicinity of the one end part 70a of the first flow path 70, on the upper surface of the substrate W. It should be noted that the pitches P1, P2 are center distance between adjacent the first discharge ports 30a. In the present embodiment, the first discharge ports 30a are provided in a total of twelve locations. Only the pitch P2 between the total of four first discharge ports 30a, which are between the most the other end part 70b side and the fourth counted from the most the other end part 70b side, is smaller than the pitch P1 between the other the first discharge ports 30a.

Unlike this embodiment, only one first discharge port 30a may be provided near the one end part 70a of the first flow path 70. Also, only one first discharge port 30a may be provided near the other end part 70b of the first flow path 70.

Figure 7:
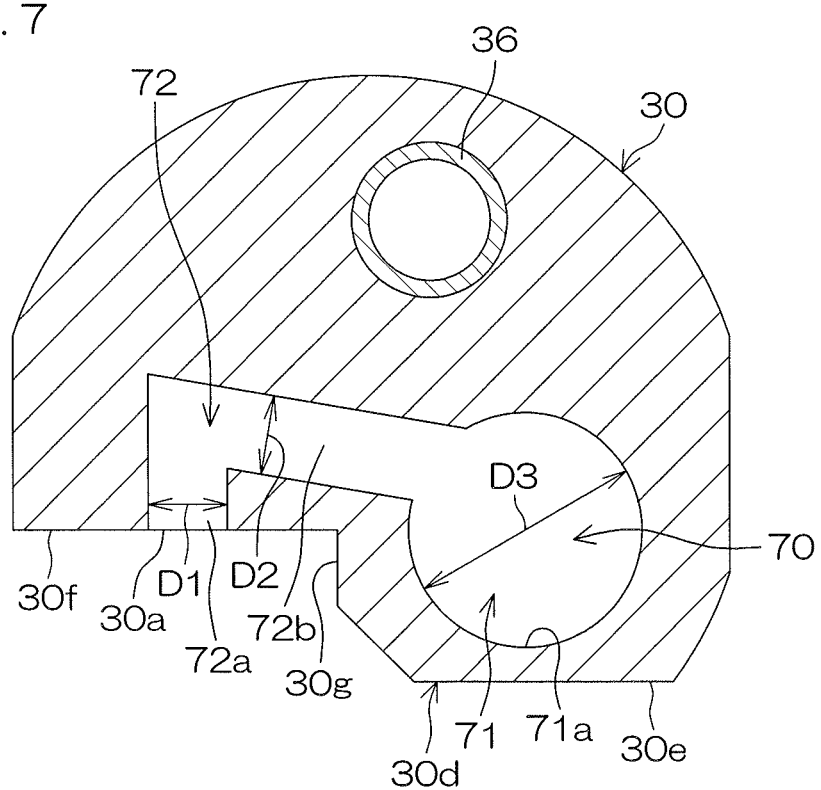
FIG. 7 is a cross-sectional view taken along the VII-VII line in FIG. 5.

Next, the configuration of the first flow path 70 will be described in detail with reference to FIG. 7. FIG. 7 is a cross-sectional view taken along VII-VII line in FIG. 5.

Referring to FIG. 7, the first flow path 70 includes a liquid storing part 71 which stores the chemical liquid supplied from the second flow path 80, a plurality of discharge flow paths 72 which connect the plurality of the first discharge port 30a and the liquid storing part 71. The liquid storing part 71 has a cylindrical form which extends in the longitudinal direction L of the first flow path 70 at lateral side of the plurality of the first discharge ports 30a. Each of the discharge flow path 72 extends laterally from the liquid storing part 71. The discharge flow path 72 is connected to each of the first discharge port 30a one by one.

Each of the discharge flow path 72 includes a cylindrical vertical flow path 72a which extends upwardly from the corresponding first discharge port 30a, and a inclined flow path 72b which connects the corresponding vertical flow path 72a and the liquid storing part 71. The inclined flow path 72b is inclined with respect to the horizontal direction such that the inclined flow path 72b goes upwardly from the liquid storing part 71 to the corresponding vertical flow path 72a. The vertical flow path 72b is cylindrical. Each of a diameter D1 of the vertical flow path 72a and a diameter D2 of the inclined flow path 72b are smaller than a diameter D3 of the liquid storing part 71. Therefore, a flow path cross-sectional area of the discharge flow path 72 is smaller than a flow path cross-sectional area of the liquid storing part 71.

A bottom surface 30d of the first chemical liquid nozzle 30 includes a first surface 30e which is positioned lower than the liquid storing part 71, and a second surface 30f which is connected to the first surface 30e via a step 30g. The second surface 30f is positioned upper than a bottom part 71a (a bottom end) of the liquid storing part 71. The second surface 30f is a flat surface. The first discharge ports 30a are formed in the second surface 30f. Therefore, the first discharge ports 30a are positioned upper than the bottom part 71a (the bottom end).

A reinforcing member 36 which extends in the longitudinal direction L is inserted into the first chemical liquid nozzle 30. The reinforcing member 36 is, for example, a hollow bar which is made of stainless steel material.

Figure 8:
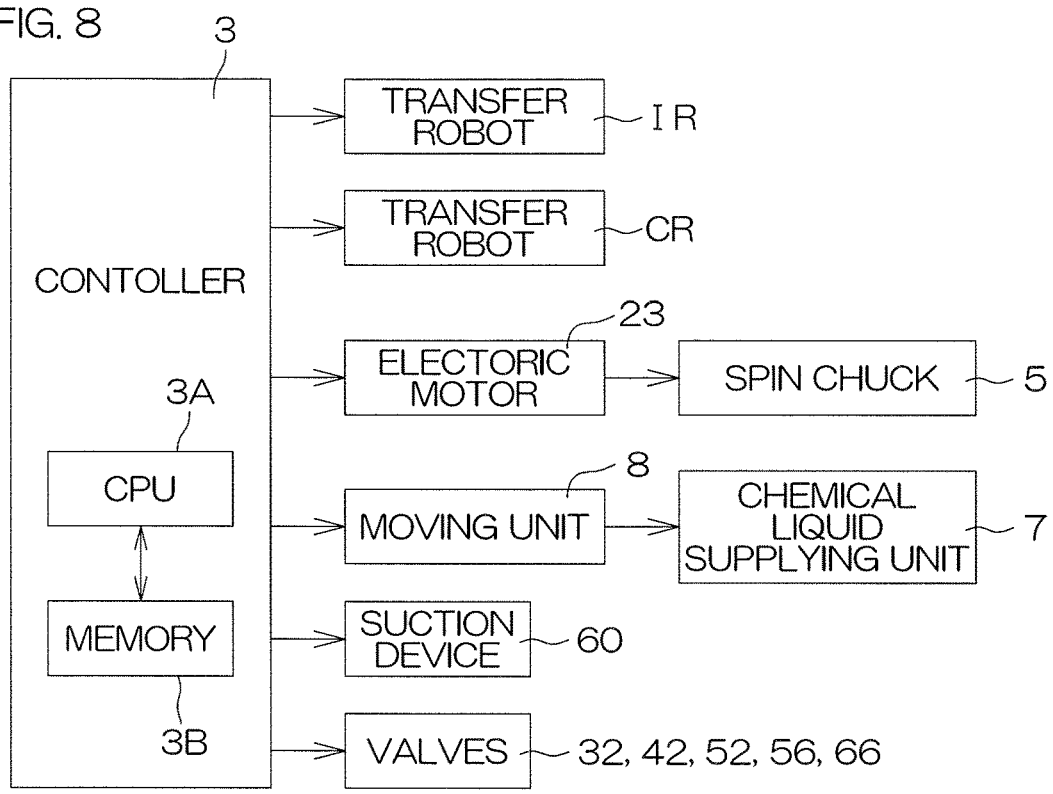
FIG. 8 is a block diagram to explain an electric configuration of a main part of the substrate processing apparatus.

FIG. 8 is a block diagram to explain an electric configuration of a main part of the substrate processing apparatus 1. The controller 3 includes a microcomputer, and controls the control objects included in the substrate processing apparatus 1 in accordance with a predetermined control programs. More specifically, the controller 3 includes a processor (CPU) 3A and a memory 3B in which a control program is stored, and is configured to perform various controls for substrate processing by executing the control program by the processor 3A. Particularly, the controller 3 controls operations of the transfer robots IR and CR, the electric motor 23, the moving unit 8, the suction device 60, and the valves 32, 42, 52, 56, 66.

Figure 9:
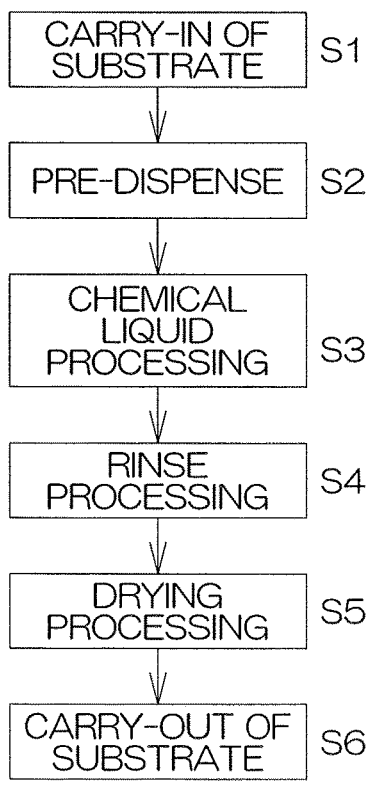
FIG. 9 is a flowchart to describe an example of substrate processing performed by the substrate processing apparatus.

FIG. 9 is a flowchart to describe an example of substrate processing performed by the substrate processing apparatus 1. FIG. 9 shows a substrate processing executed by the controller 3 executing a program. In this substrate processing, the substrates W are successively processed one by one. In the substrate processing of each of the substrate W, for example, as shown in FIG. 9, a carry-in of substrate (S1), a pre-dispense (S2), a chemical liquid processing (S3), a rinse processing (S4), a drying processing (S5) and a carry-out of substrate (S6) are executed in this order.

In the substrate processing, first, an unprocessed substrate W is carried from the carrier C into the processing unit 2 by the transfer robots IR and CR, and is delivered to the spin chuck 5 (S1). Thereafter, the substrate W is held horizontally at a distance above the upper surface of the spin base 21, until the substrate W is carried out by the transfer robot CR (a substrate holding step).

After the substrate W is carried in, before the substrate W is processed by the chemical liquid, the pre-dispense (S2) in which the chemical liquid is discharged from the first chemical liquid nozzle 30 and the second chemical liquid nozzle 40 is started. In the substrate processing for successively processing the substrate W one by one by the processing unit 2, due to executing the pre-dispense (S2), it is possible to reduce the difference, in the temperature of the chemical liquid supplied to the substrate W in the chemical liquid processing (S3), between the substrates W processed by the same processing unit 2. Therefore, the difference of the quality between the substrates W can be reduced. While only one second discharge port 40a of the second chemical liquid nozzle 40 is provided, the plurality of the first discharge port 30a of the first chemical liquid nozzle 30 are provided. Therefore, usually, the flow rate of the processing liquid discharged from the second chemical liquid nozzle 40 (flows in the second chemical liquid nozzle 40) is smaller than the flow rate of the processing liquid discharged from the first chemical liquid nozzle 30 (flows in the second chemical liquid nozzle 30). Therefore, the temperature of the processing liquid in the second chemical liquid nozzle 40 is more likely to change due to surrounding environment than the temperature of the processing liquid in the first chemical liquid nozzle 30. As a result, temperature control by the pre-dispense (S2) becomes more important at the second chemical liquid nozzle 40 than the first chemical liquid nozzle 30.

Figure 10A:
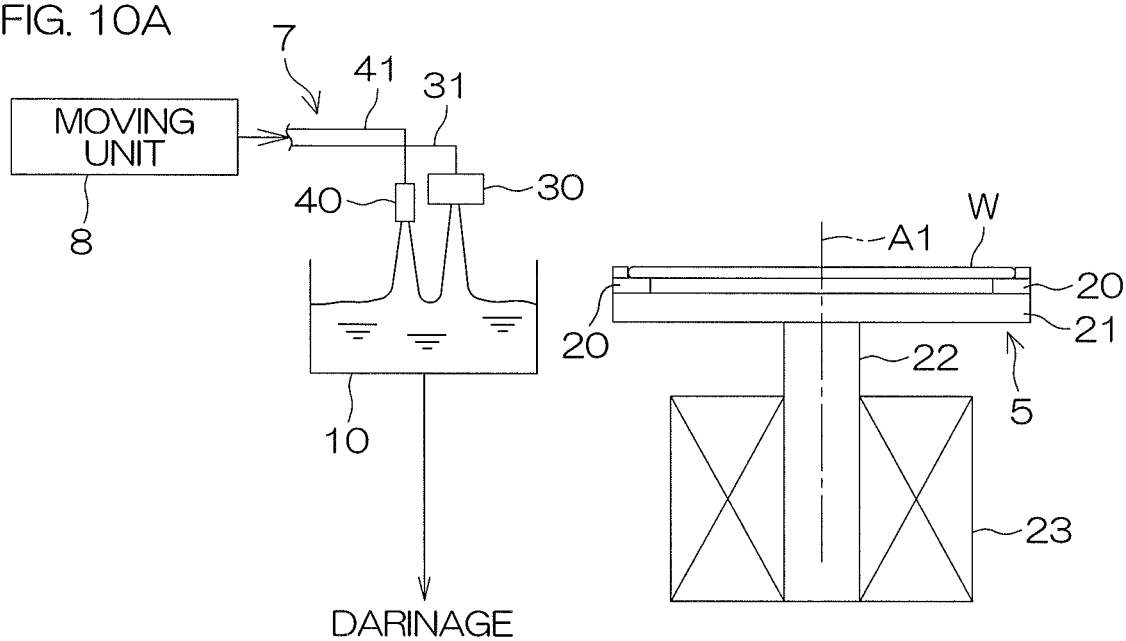
FIG. 10A is an illustrative side view for explaining a pre-dispensing (S2 in FIG. 9) of the substrate processing.
Figure 10B:
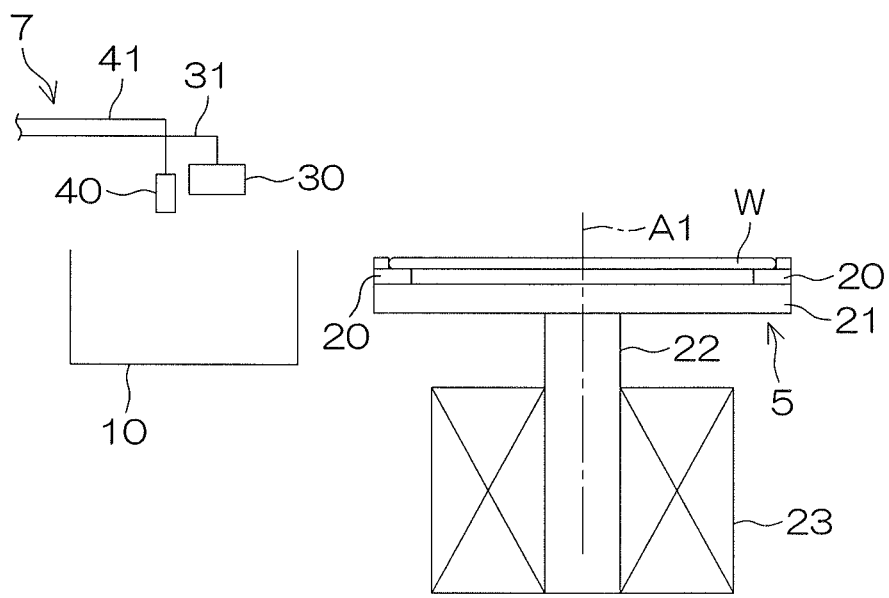
FIG. 10B is an illustrative side view for explaining the pre-dispensing (S2 in FIG. 9) of the substrate processing.
Figure 10C:
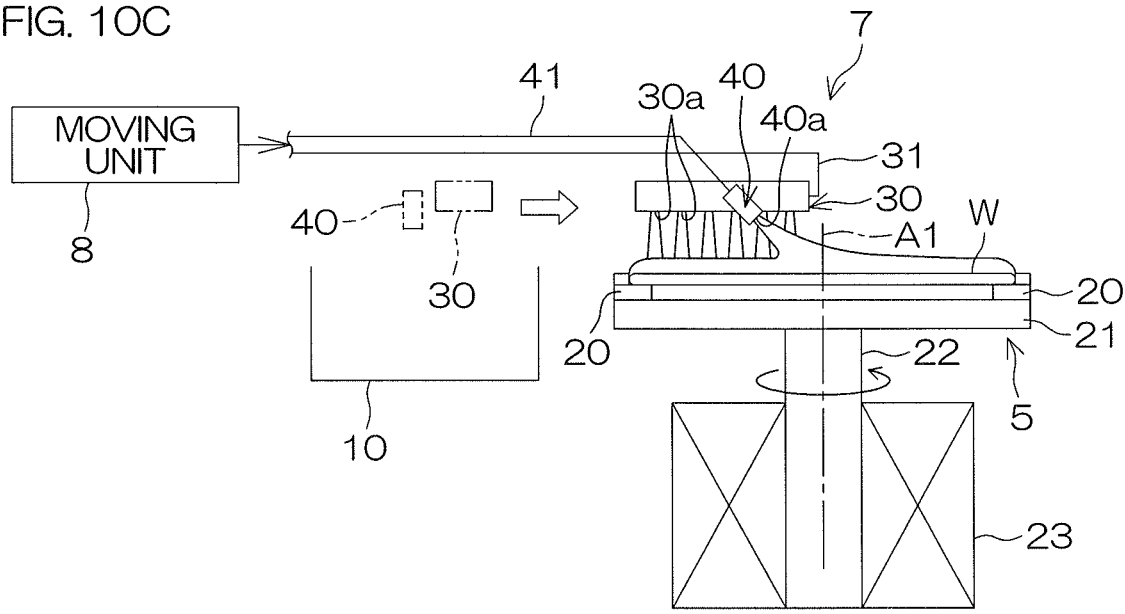
FIG. 10C is an illustrative side view for explaining a chemical liquid processing (S3 in FIG. 9) of the substrate processing.

FIG. 10A and FIG. 10B are illustrative side views for explaining pre-dispensing (S2 in FIG. 9) of the substrate processing. FIG. 10C is an illustrative side view for explaining a chemical liquid processing (S3 in FIG. 9) of the substrate processing.

In the pre-dispense (S2), as shown in FIG. 10A, the moving unit 8 places the chemical liquid supplying unit 7 at the retreat position. Then, the first electric valve 32 and the second electric valve 42 are opened. Therefore, the chemical liquid is discharged from the plurality of the first discharge ports 30a of the first chemical liquid nozzle 30 and the second discharge port 40a of the second chemical liquid nozzle 40. The chemical liquid discharged from the first discharge ports 30a and the second discharge port 40a is received by the standby pot 10. By opening the draining valve 56, the chemical liquid in the standby pot 10 is eliminated from the standby pot 10.

After the chemical liquid is discharged from the plurality of the first discharge ports 30a of the first chemical liquid nozzle 30 and the second discharge port 40a of the second chemical liquid nozzle 40 for a predetermined time, the first electric valve 32 and the second electric valve 42 are closed. As a result, as shown in FIG. 10B, discharge of the chemical liquid from the plurality of the first discharge ports 30a of the first chemical liquid nozzle 30 and the second discharge port 40a of the second chemical liquid nozzle 40 is stopped.

Then, after the pre-dispense (S2) for a fixed time, the chemical liquid processing (S3) is started. Specifically, as shown in FIG. 10C, the electric motor 23 rotates the spin base 21. Therefore, the substrate W which is held by the chuck pins 20 horizontally is rotated (a substrate rotating step). Also, the moving unit 8 moves the chemical liquid supplying unit 7 to the process position. After that, the first electric valve 32 and the second electric valve 42 are opened. Therefore, the chemical liquid is discharged from the plurality of the first discharge ports 30a of the first chemical liquid nozzle 30 and the second discharge port 40a of the second chemical liquid nozzle 40. The chemical liquid discharged from the first discharge ports 30a and the second discharge port 40a lands on the upper surface of the substrate W. The chemical liquid supplied thereto spreads across the entirety of the upper surface of the substrate W by means of a centrifugal force. As a result, the upper surface of the substrate W is processed by the chemical liquid.

Next, after the chemical liquid processing (S3) for a fixed time, the rinse processing (S4) for excluding the chemical liquid from the upper surface of the substrate W by replacing the chemical liquid on the substrate W with the rinse liquid is executed.

Specifically, the first electric valve 32 and the second electric valve 42 are closed, and the rinse liquid valve 52 is opened. Therefore, the rinse liquid is supplied (discharged) from the rinse liquid nozzle 50 toward the upper surface of the substrate W. The rinse liquid discharged from the rinse liquid nozzle 50 lands on the central region of the upper surface of the substrate W. The rinse liquid supplied thereto spreads across the entirety of the upper surface of the substrate W by means of a centrifugal force. The chemical liquid on the substrate W is washed out by this rinse liquid. Meanwhile, the moving unit 8 retreats the chemical liquid supplying unit 7 to the retreat position. Before moving the chemical liquid supplying unit 7, the suction device 60 sucks the chemical liquid in the first flow path 70 of the first chemical liquid nozzle 30.

Next, the drying processing (S5) is executed. Specifically, the rinse liquid valve 52 is closed. Then, the electric motor 23 rotates the substrate W at a high rotation speed (for example 3000 rpm). As a result, a large centrifugal force acts on the rinse liquid on the substrate W, and the rinse liquid on the substrate W is shaken off around the substrate W. The rinse liquid is thereby removed from the substrate W, and the substrate W is dried. Then, when a predetermined time has elapsed since the high speed rotation of substrate W was started, the electric motor 23 stops the rotation of the substrate W by the spin base 21.

Thereafter, the transfer robot CR enters the processing unit 2, and scoops an already-processed substrate W from the spin chuck 5, and carries it out of the processing unit 2 (S6). The substrate W is delivered from the transfer robot CR to the transfer robot IR, and is stored in the carrier C by means of the transfer robot IR. Then, the substrate processing of the next unprocessed substrate W is started.

Figure 11:
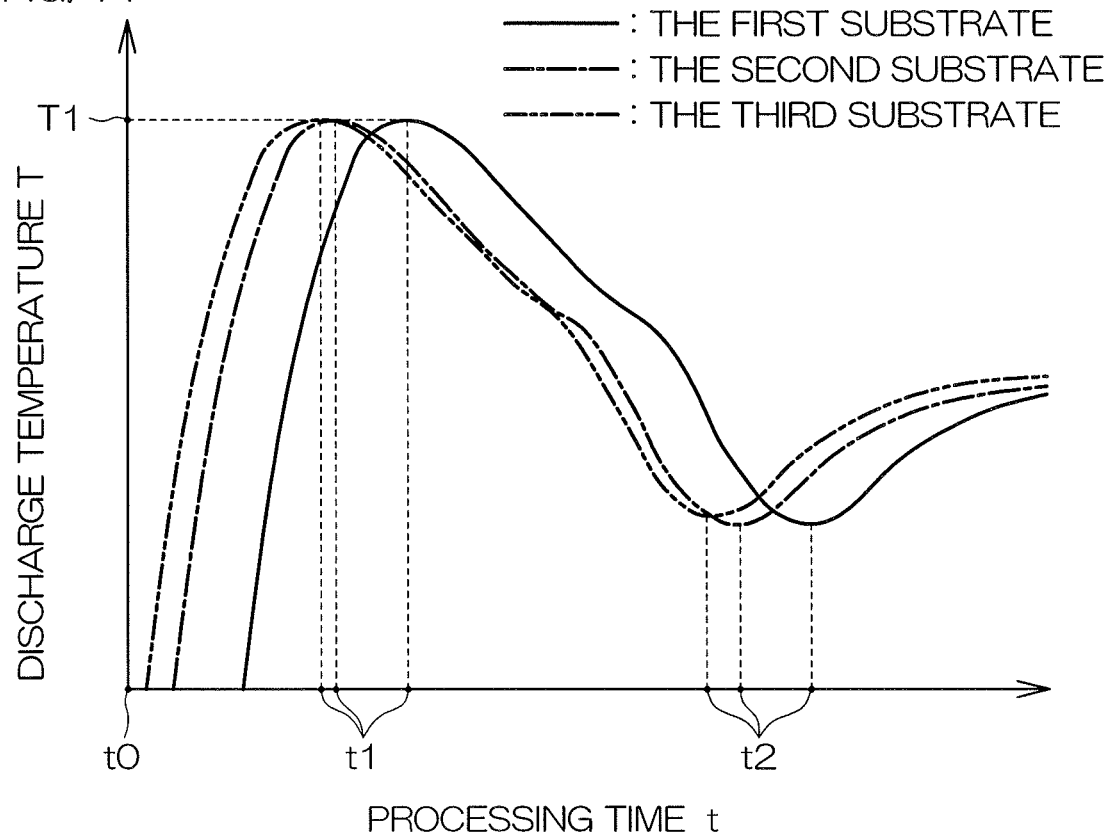
FIG. 11 is a graph of an example of temporal change of the temperature of the processing liquid supplied to the processing liquid nozzle in the substrate processing shown in FIG. 9.

Next, an example of the pre-dispense (S2) will be described in detail with reference to FIG. 11. FIG. 11 is a graph of an example of temporal change of temperature of the chemical liquid discharged from the chemical liquid nozzle 30 in the substrate processing shown in FIG. 9. In FIG. 11, the horizontal axis shows the processing time t and the vertical axis shows the temperature of the chemical liquid discharged from the first chemical liquid nozzle 30, that is, the discharge temperature T. The discharge temperature T is the temperature which is detected by the first temperature sensor 34. Therefore, the discharge temperature T is strictly the temperature of the chemical liquid in the first chemical liquid supplying pipe 35. In FIG. 11, the temporal change of the discharge temperatures T of each of the substrates W processed in the first to the third in the substrate processing for successively processing the substrate W is shown. Here, the temporal change of the discharge temperature T of the second chemical liquid nozzle 40 is substantially the same as the temporal change of the discharge temperature T of the first chemical liquid nozzle 30, so that a detailed explanation will be omitted.

In the pre-dispense (S2), for example, the discharge flow rate of the chemical liquid is set the same discharge flow rate as the discharge flow rate in the chemical liquid processing (S3) (a processing flow rate), and the discharge of the chemical liquid from the first chemical liquid nozzle 30 to the standby pot 10 is started. That is, the discharge flow rate of the chemical liquid is constant. The discharge flow rate of the chemical liquid is the flow rate which is detected by the first flowmeter 33. Setting of the discharge flow rate of the chemical liquid is executed by changing opening degree of the first electric valve 32. The time when the discharge of the chemical liquid from the first chemical liquid nozzle 30 to the standby pot 10 is defined a time t0 (a pre-dispense starting step).

The new chemical liquid is continued to be supplied to the chemical liquid supplying unit 7. Therefore, the temperature of the chemical liquid supplying unit 7 (especially, tube walls of the first chemical liquid nozzle 30 and the first chemical liquid pipe 31) and its surrounding members rises with the passage of the processing time t. Conversely, the heat of the chemical liquid which flows through the inside of the first chemical liquid nozzle 30 and the first chemical liquid pipe 31 is deprived by the chemical liquid supplying unit 7 and its surrounding members. Therefore, the discharge temperature T of the chemical liquid from the first chemical liquid nozzle 30 at the start of the pre-dispense (the time t0) is considerably lower than the temperature (a saturation temperature T1) at which the temperature of the chemical liquid supplying unit 7 and its surrounding members and the temperature of the chemical liquid flows inside of the first chemical liquid nozzle 30 and the first chemical liquid pipe 31 reach equilibrium.

Accompanied with continuing the discharge of the chemical liquid from the first chemical liquid nozzle 30, the temperature of the chemical liquid supplying unit 7 and its surrounding members rises up, thereby, the heat which is deprived by the chemical liquid supplying unit 7 and its surrounding members are reduced. By further continuing the discharge of the chemical liquid from the first chemical liquid nozzle 30, the chemical liquid at the saturation temperature T1 becomes to be discharged from the first chemical liquid nozzle 30.

The time when the discharge temperature T reaches the saturation temperature T1 is defined as a time t1. The period (hereinafter referred to as "a reaching period") from the start of the pre-dispense (the time t0) until the chemical liquid at saturation temperature T1 is discharged from the first chemical liquid nozzle 30 (the time t1) depends on the temperature of the chemical liquid supplying unit 7 and its surrounding members before starting the pre-dispense. The larger the difference between the temperature, of the chemical liquid supplying unit 7 and its surrounding members before starting the pre-dispense, and the saturation temperature T1 is, the longer the reaching period is. The smaller the difference between the temperature, of the chemical liquid supplying unit 7 and its surrounding members before starting the pre-dispense, and the saturation temperature T1 is, the shorter the reaching period is.

In a case where the substrates W are successively processed in the processing unit 2, at the beginning of the continuous process (for example, the processing of the first and second substrates W), the temperature of the chemical liquid supplying unit 7 and its surrounding members before starting the pre-dispense is relatively low. Especially, in the processing of the first substrate W, the temperature of the chemical liquid supplying unit 7 and its surrounding members before starting the pre-dispense may be lowered to, for example, room temperature (for example approximately 25° C.).

In the example shown in FIG. 11, when the discharge temperature T reaches the saturation temperature T1 after lapsing the reaching period from the start of the pre-dispense, the discharge of the chemical liquid from the first chemical liquid nozzle 30 is stopped (a pre-dispense stopping step). Then, the moving unit 8 starts to move the chemical liquid supplying unit 7 to the process position (a chemical liquid supplying unit moving step). While the chemical liquid supplying unit 7 moves, new chemical liquid is not supplied to the chemical liquid supplying unit 7, so that the temperature of the chemical liquid supplying unit 7 gradually decreases and the temperature of the chemical liquid in the first chemical liquid nozzle 30 and the first chemical liquid pipe 31 decreases. When the chemical liquid supplying unit 7 reaches the process position, the first electric valve 32 is opened again. Therefore, the supply of the chemical liquid from the first chemical liquid nozzle 30 to the upper surface of the substrate W is started (a chemical liquid supplying step). The time at which the chemical liquid supplying unit 7 reaches the process position is defined as a time t2.

As shown in FIG. 11, the later the processing order of the substrate is, the time t1 and the time t2 becomes earlier. Although not shown, the time t1 and the time t2 in the processing of the fourth and subsequent substrates W, are substantially equal to the time t1 and the time t2 in the processing of the third substrate W, respectively.

That is, in the example shown in FIG. 11, the pre-dispense period of the first substrate W is made longer than the pre-dispense period of the second substrate W, and the pre-dispense period of the second substrate W is made longer than the pre-dispense period of the third substrate W. The pre-dispense period of the fourth and subsequence substrates W is substantially same as the pre-dispense period of the third substrate W.

By executing the pre-dispense with this method, the difference in the discharge temperature T between each of the substrate processing at the start of the chemical liquid processing can be surely reduced.

Figure 12:
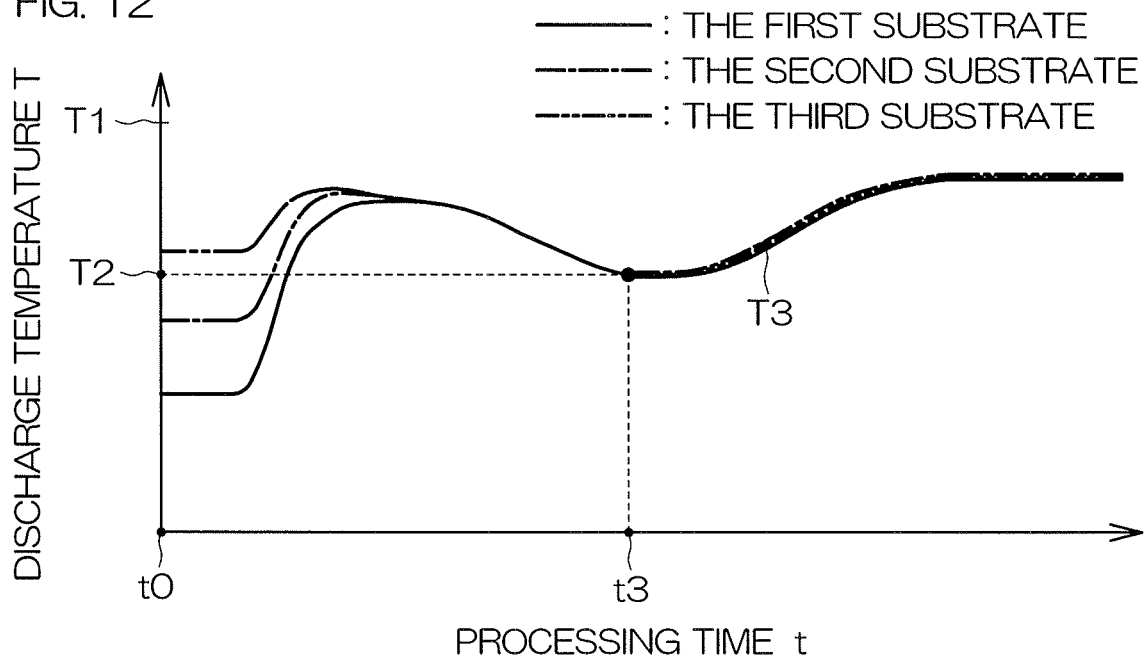
FIG. 12 is a graph of the other example of temporal change of temperature of the processing liquid supplied to the processing liquid nozzle in the substrate processing shown in FIG. 9.

Next, the other example of the pre-dispense (S2) will be described in detail with reference to FIG. 12. FIG. 12 is a graph of the other example of temporal change of temperature of the chemical liquid discharged from the first chemical liquid nozzle 30 in the substrate processing shown in FIG. 9. In FIG. 12, the horizontal axis shows the processing time t and the vertical axis shows the discharge temperature T. In FIG. 12, the temporal change of the discharge temperatures T of each of the substrates W processed in the first to the third in the substrate processing for successively processing the substrate W is shown. Here, the temporal change of the discharge temperature T of the second chemical liquid nozzle 40 is substantially the same as the temporal change of the discharge temperature T of the first chemical liquid nozzle 30, so that a detailed explanation will be omitted.

The time, from the discharge of the chemical liquid from the first chemical liquid nozzle 30 to the standby pot 10, is defined a time t0 (the pre-dispense staring step). The time, at which the supply of the chemical liquid is started from the first chemical liquid nozzle 30 to the upper surface of the substrate W after the chemical liquid supplying unit 7 moves to the process position after the end of the pre-dispense, is defined as a time t3. The time at which the supply of the chemical liquid is started is set, such that regardless of how many substrates W are processed the period between the time t0 and the time t3 is constant (a chemical liquid supplying time setting step). Then, the opening degree of the first electric valve 32 is adjusted to control the discharge flow rate, such that the discharge temperature T of the chemical liquid discharged from the first chemical liquid nozzle 30 reaches a target temperature T2 which is lower than the saturation temperature T1 when a fixed period has elapsed since the start of the pre-dispense (at the point of the time t3). When the discharge flow rate is decreased, the heat of the chemical liquid of the entire chemical liquid supplied to the chemical liquid supplying unit 7 decreases, so that the discharge temperature T decreases. On the other hand, when the discharge flow rate is increased, the heat of the chemical liquid of the entire chemical liquid supplied to the chemical liquid supplying unit 7 increases, so that the discharge temperature T increases.

As previously mentioned, in the case where the substrates W are successively processed in the processing unit 2, at the beginning of the continuous process (for example, the processing of the first and second substrates W), the temperature of the chemical liquid supplying unit 7 and its surrounding members before starting the pre-dispense is relatively low. Therefore, the discharge flow rate in the pre-dispense of the first substrate W is made larger than the discharge flow rate in the pre-dispense of the second substrate W, and the discharge flow rate in the pre-dispense of the second substrate W is made larger than the discharge flow rate in the pre-dispense of the third substrate W. The discharge flow rate in the pre-dispense of the fourth and subsequence substrates W is substantially same as the pre-dispense period of the third substrate W.

After starting of the supply of the chemical liquid from the first chemical liquid nozzle 30 to the upper surface of the substrate W, the controller 3 adjusts the opening degree of the first electric valve 32, for example, so as to reduce the difference of the discharge temperature T between each of the substrate processing (an opening degree adjusting step). The controller 3 executes a feedback control which is based on the flow rate detected by the first flowmeter 33. In FIG. 12, with passage of the processing time t in the chemical liquid processing (S3), an example of changing a target temperature T3 after start of the supply of the chemical liquid is shown. Even in this case, it is possible to reduce the difference in the discharge temperature T between each of the substrate processing, by constantly detecting the flow rate by the first flowmeter 33 and constantly adjusting the opening degree of the first electric valve 32.

According to this method, the target temperature T2 and the target temperature T3 are lower than the saturation temperature T1, so that the period of the pre-dispense (S2) can be shorten and consumption of the chemical liquid can be reduced. Additionally, the difference in the discharge temperature T between each of the substrate processing can be further reduced by executing the feedback control.

Here, generally, in a nozzle which has a flow path closed at a one end, a pressure of the processing liquid near the one end of the flow path is larger compared to the rest of the flow path. Therefore, the flow rate of the processing liquid discharged from a discharge port positioned near a tip end of the flow path tends to be larger than the flow rate of the processing liquid discharged from a discharge port positioned near a base end of the flow path.

According to the first preferred embodiment, the chemical liquid is supplied from the second flow path 80 to the one end part 70*a* of the first flow path 70. The plurality of the first discharge ports 30*a* are arranged along the direction (the longitudinal direction L) in which the first flow path 70 extends. Therefore, in the first chemical liquid nozzle 30, the flow rate at the first discharge port 30*a* positioned near the other end part 70*b* of the first flow path 70 becomes larger than the flow rate at the first discharge ports 30*a* positioned near the one end part 70*a* of the first flow path 70.

In the state where the chemical liquid supplying unit 7 is positioned at the process position, the one end part 70*a* of the first flow path 70 faces the central region of the substrate W, and the other end part 70*b* of the first flow path 70 faces the peripheral region of the substrate W. Therefore, the flow rate of the chemical liquid which is supplied to the peripheral region of the upper surface of the substrate W can be increased more than the flow rate of the chemical liquid which is supplied to the central region of the upper surface of the substrate W. Processing unevenness on the upper surface of the substrate W can thus be reduced.

Furthermore, the second flow path 80 which supplies the chemical liquid to the one end part 70*a* of the first flow path 70 extends by folding back from the one end part 70*a* of the first flow path 70, so that the first flow path 70 and the second flow path 80 can be arranged adjacent to each other. Furthermore, the whole of the chemical liquid supplying unit 7 is moved by the moving unit 8, so that the state where the first flow path 70 and the second flow path 80 are adjacent to each other is maintained during the movement of the chemical liquid supplying unit 7. Therefore, the chemical liquid in the first flow path 70 can be kept warm by the chemical liquid in the second flow path 80. Lowering of the temperature of the chemical liquid heading to the first discharge ports 30*a* can thus be suppressed. As a result, the temperature of the chemical liquid which is discharged from the first discharge port 30*a* and lands on the upper surface of the substrate W can be maintained at a high temperature, so that the upper surface of the substrate W can be processed with the chemical liquid at the desired high temperature.

As described above, it is possible to process the upper surface of the substrate W with the chemical liquid at the desired high temperature and reduce processing unevenness on the upper surface of the substrate W.

According to the first preferred embodiment, the first flow path 70 extends in parallel with the upper surface of the substrate W. Therefore, the difference in the distance between the first discharge port 30*a* and the substrate W, between the plurality of the first discharge ports 30*a* can be reduced. The difference, in heat lost from the chemical liquid from the time when the chemical liquid is discharged from the first discharge ports 30*a* to the time when the chemical liquid lands on the surface of the substrate W, between the plurality of the first discharge ports 30 can thus be reduced. As a result, processing unevenness on the upper surface of the substrate W can be reduced.

According to the first preferred embodiment, the second flow path 80 extends in parallel with the first flow path 70. Therefore, the first flow path 70 and the second flow path 80 can be brought close to each other in the entire region in the direction (the longitudinal direction L) in which the first flow path 70 extends. As a result, the chemical liquid in the first flow path 70 is effectively kept warm by the chemical liquid in the second flow path 80. Furthermore, the first flow path 70 and the second flow path 80 extend in parallel, so that the chemical liquid in the first flow path 70 evenly kept warm in the entire region in the longitudinal direction L. In other words, occurrence of a state, where the temperature of the chemical liquid in the first flow path 70 is not partially kept warm, can be prevented. Therefore, the difference in the temperature of the discharged chemical liquid between the first discharge ports 30*a* can be reduced. Uneven processing on the upper surface of the substrate W can thus be reduced.

Miniaturization of the chemical liquid supplying unit 7 can thus be achieved by bringing the first flow path 70 and the second flow path 80 close.

The second flow path 80 is folded back from the one end part 70*a* of the first flow path 70 and extends in parallel with the first flow path 70. Therefore, the chemical liquid flows through the vicinity of the other end part 70*b* of the first flow path 70 is kept warm by the chemical liquid which flows through a portion on the upstream side in the second flow path 80. That is, compared to the chemical liquid which flows through the vicinity of the one end part 70a of the first flow path 70, the chemical liquid through the vicinity of the other end part 70b of the first flow path 70 is kept warm by the high temperature chemical liquid. As a result, the temperature difference of the chemical liquid in the first flow path 70 can be reduced.

According to the first preferred embodiment, the chemical liquid supplying unit 7 further includes the first chemical liquid pipe 31 (a flow path forming pipe) in which the second flow path 80 is formed. The first chemical liquid pipe 31 supports the first chemical liquid nozzle 30. That is, the chemical liquid pipe 31 in which the second flow path 80 is formed also serves a member which supports the first chemical liquid nozzle 30. Miniaturization of the chemical liquid supplying unit 7 can thus be achieved.

According to the first preferred embodiment, the moving unit 8 includes the pivoting unit 27 which turns the chemical liquid supplying unit 7 around the pivoting axis A2 along the vertical direction. Therefore, the chemical liquid supplying unit 7 can be moved between the process position and the retreat position by a simple motion of turning around the pivoting axis A2.

According to the first preferred embodiment, the plurality of the first discharge port 30a are provided, such that the flow rate of the chemical liquid, which is supplied to the region facing the vicinity of the other end part 70b of the first flow path 70 in the upper surface of the substrate W, is larger than the flow rate of the chemical liquid which is supplied to the region facing the vicinity of the one end part 70a of the first flow path 70 in the upper surface of the substrate W. Therefore, the flow rate of the chemical liquid which is supplied to the peripheral region of the upper surface of the substrate W can be made even larger than the flow rate of the chemical liquid which is supplied to the central region of the upper surface of the substrate W. As a result, the reduction in the temperature of the chemical liquid at the peripheral region of the upper surface of the substrate W can be suppressed, so that the reduction in the etching rate at the peripheral region of the upper surface of the substrate W can be prevented.

According to the first preferred embodiment, the processing unit 2 includes the suction unit 11 which sucks the chemical liquid in the first flow path 70. The chemical liquid remains in the first flow path 70, for example, when the state is switched from the state, in which the chemical liquid is supplied, to the state in which the supply of the chemical liquid is stopped. In this state, when the moving unit 8 moves the chemical liquid supplying unit 7, the chemical liquid, which remains in the first flow path 70, may fall as droplets. Particles may occur at the upper surface of the substrate W due to such unintentional fall of the chemical liquid. Therefore, by letting the suction unit 11 suck the chemical liquid in the first flow path 70, it is possible to prevent the chemical liquid from remaining in the first flow path 70 when the supply of the chemical liquid is stopped. Falling of the chemical liquid to the substrate W can thus be suppressed when the supply of the chemical liquid is stopped.

According to the first preferred embodiment, the suction unit 11 includes the suction flow path 65a which is connected to the vicinity 80a of the one end part 70a of the first flow path 70, and the suction device 60 which sucks the inside of the first flow path 70 via the suction flow path 65a. Therefore, the suction device 60 can effectively suck the chemical liquid in the first flow path 70. On the other hand, it is possible to prevent the chemical liquid in the second flow path 80 from being sucked more than necessary.

Therefore, it is possible to prevent the chemical liquid from being wasted by sucking the chemical liquid more than necessary, and the chemical liquid in the first flow path 70 can be removed efficiently.

According to the first preferred embodiment, the first flow path 70 includes the liquid storing part 71 in which the chemical liquid which is supplied from the second flow path 80 is stored, the discharge flow paths 72 which extend laterally from the liquid storing part 71. Each of the discharge flow paths 72 connects the corresponding first discharge port 30a and the liquid storing part 71.

Therefore, the chemical liquid, which is supplied from the second flow path 80 to the first flow path 70, is discharged from the first discharge ports 30a via the liquid storing part 71 and the discharge flow path 72 in order. When the supply of the chemical liquid from the second flow path 80 to the first flow path 70 is stopped, the chemical liquid in the first flow path 70 remains in the liquid storing part 71 and the discharge flow path 72. The discharge flow path 72 extends laterally from the liquid storing part 71, so that the chemical liquid in the discharge flow path 72 hardly bears the weight of the chemical liquid in the liquid storing part 71. Compared to the configuration in which the discharge flow path 72 extends downwardly from the liquid storing part 71, the chemical liquid in the discharge flow path 72 hardly bears the weight of the chemical liquid in the liquid storing part 71. The falling of the chemical liquid from the discharge flow path 72 via the first discharge port 30 to the substrate W can thus be suppressed, when the supply of the chemical liquid stops.

According to the first preferred embodiment, the discharge flow path 72 includes the vertical flow path 72a extends upwardly from the first discharge port 30a, and the inclined flow path 72b which connects the vertical flow path 72a and the liquid storing part 71. The inclined flow path 72b is inclined with respect to the horizontal direction as the inclined flow path goes upwardly from the liquid storing part 71 to the vertical flow path 72a. Therefore, even though the chemical liquid remains in the discharge flow path 72, the chemical liquid is easy to return to the liquid storing part 71 via the inclined flow path 72b. The weight, which the chemical liquid in the discharge flow path 72 bears, can thus be further reduced.

According to the first preferred embodiment, the first discharge port 30a is positioned higher than the bottom part 71a of the liquid storing part 71. Therefore, compared to the configuration in which the first discharge port 30a is positioned lower than the liquid storing part 71, the discharge flow path 72 can be shorten. As a result, the weight, which the chemical liquid in the discharge flow path 72 bears, can thus be further reduced.

According to the first preferred embodiment, the cross-sectional area of the discharge flow path 72 is smaller than the cross-sectional area of the liquid storing part 71. Therefore, a surface tension, which acts on the chemical liquid in the discharge flow path 72, can be increased, so that the chemical liquid is easy to remain in the discharge flow path 72. Falling of the chemical liquid to the substrate W can thus be suppressed, when supply of the processing liquid is stopped.

Second Preferred Embodiment

Figure 13:
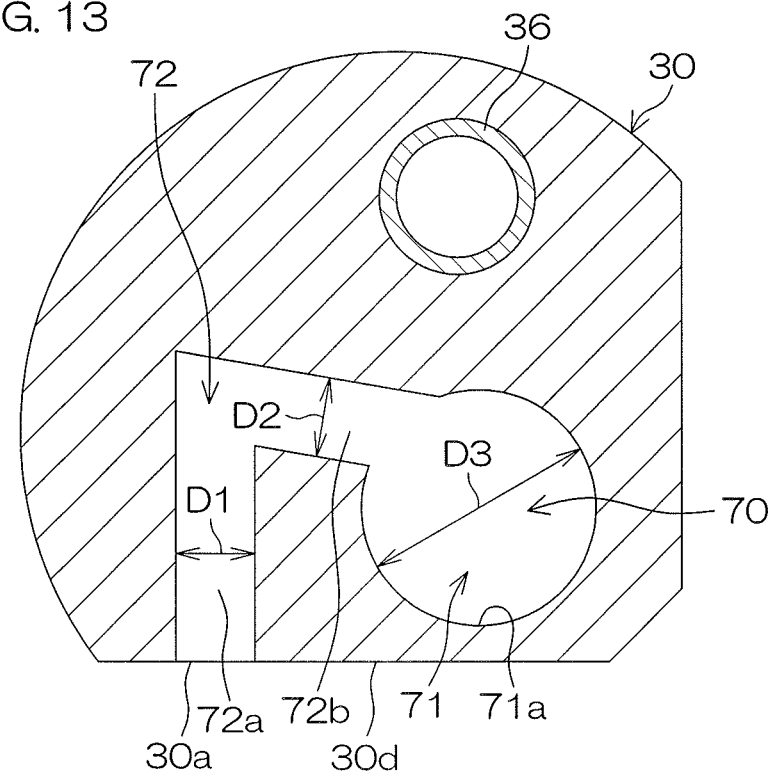
FIG. 13 is a cross-sectional view of a processing liquid nozzle according to a second preferred embodiment of the present invention.

Next, the second preferred embodiment will be explained. FIG. 13 is a cross-sectional view of the first chemical liquid nozzle 30 according to a second preferred embodiment of the present invention. FIG. 13 is a cross-sectional view of the first chemical liquid nozzle 30 cut along a plane orthogonal to the longitudinal direction L. In FIG. 13, the same reference numerals are given to the same members as those described so far, and the description thereof is omitted.

In the first chemical liquid nozzle 30 according to the second preferred embodiment, unlike the first preferred embodiment, the step 30g is not provided in the bottom surface 30d of the first chemical liquid nozzle 30, and the bottom surface 30d is a flat surface. Furthermore, the first discharge port 30a is formed in the bottom surface 30d. Therefore, the first discharge port 30a is positioned lower than the bottom part 71a of the liquid storing part 71. The bottom surface 30d of the first chemical liquid nozzle 30 is a flat surface, so that the processing (manufacturing) of the first chemical liquid nozzle 30 can be simplified.

Third Preferred Embodiment

Figure 14:
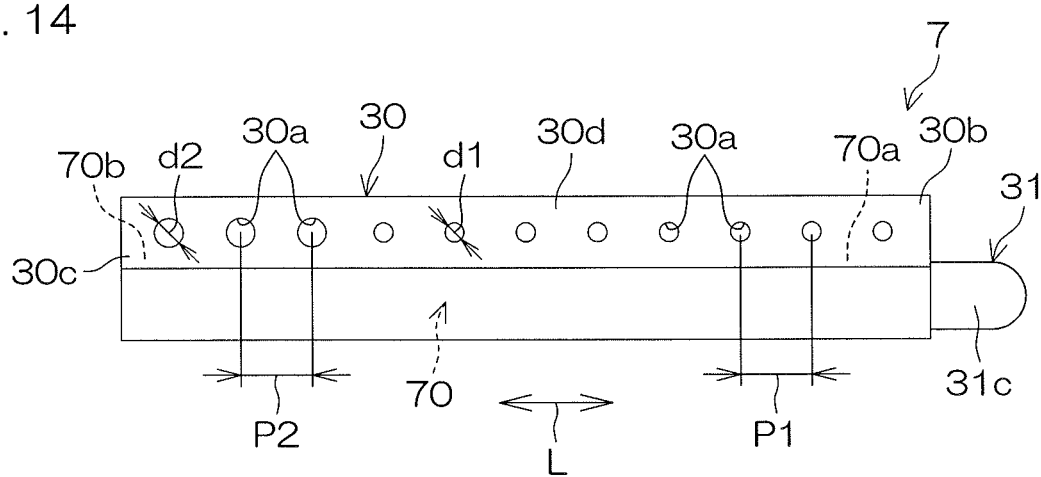
FIG. 14 is a bottom view of a processing liquid nozzle according to a third preferred embodiment of the present invention.

Next, the third preferred embodiment will be explained. FIG. 14 is a bottom view of the first chemical liquid nozzle 30 according to the third preferred embodiment. In FIG. 14, the same reference numerals are given to the same members as those described so far, and the description thereof is omitted.

In the first chemical liquid nozzle 30 according to the third preferred embodiment, unlike the first preferred embodiment, the first discharge port 30a near the other end part 70b of the first flow path 70 is larger than the first discharge port 30a near the one end part 70a of the first flow path 70. A diameter d2 of the first discharge port 30a near the other end part 70b is larger than a diameter d1 of the first discharge port 30a near the one end part 70a of the first flow path 70. That is, as the first preferred embodiment, the plurality of the first discharge ports 30a are configured such that the flow rate of the chemical liquid which is supplied to the peripheral region of the upper surface of the substrate W is larger than the flow rate of the chemical liquid which is supplied to the central region of the upper surface of the substrate W.

In the third preferred embodiment, the eleven first discharge ports 30a are provided in total. The diameter d2 of the three first discharge ports 30a in total, which are between the most the other end part 70b side and the third counted from the most the other end part 70b side, is larger than the diameter of the other first discharge ports 30a.

According to the third preferred embodiment, the flow rate of the chemical liquid which is supplied to the peripheral region of the upper surface of the substrate W, can be further increased than the flow rate of the chemical liquid which is supplied to the central region of the upper surface of substrate W. As a result, a reduction in the temperature of the chemical liquid at the peripheral region of the upper surface of the substrate can be suppressed, so that the reduction in the etching rate at the peripheral region of the upper surface of the substrate W can be prevented.

In the third preferred embodiment, the distance between each of the first discharge ports 30a is equal (P1=P2). Also in this embodiment, as in the first preferred embodiment, the distance (the pitch P2) between each of the first discharge ports 30a near the other end part 70b of the first flow path 70 may be smaller than the distance (the pitch P1) between each of the first discharge ports 30a near the one end part 70a of the first flow path 70 (P2<P1). If so, the flow rate of the chemical liquid, which is supplied to the peripheral region of the upper surface of the substrate W, can be further increased more than the flow rate of the chemical liquid which is supplied to the central region of the upper surface of the substrate W.

Fourth Preferred Embodiment

Figure 15:
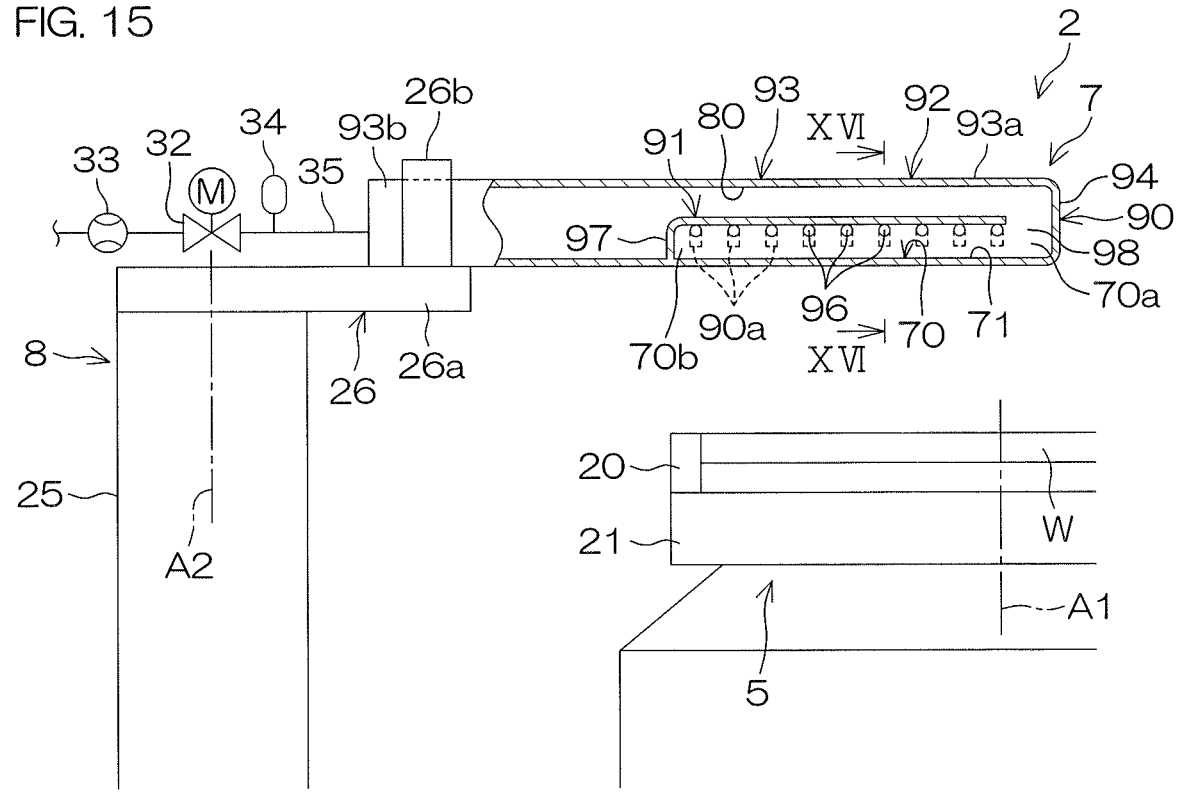
FIG. 15 is a side view of a processing liquid supplying unit according to a forth preferred embodiment of the present invention and its surroundings.
Figure 16:
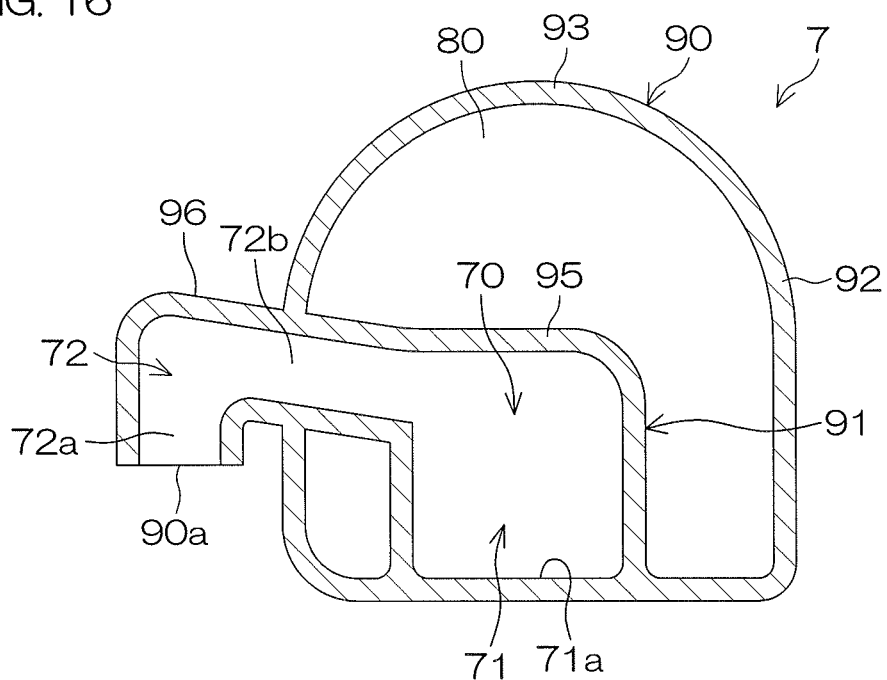
FIG. 16 is a cross-sectional view taken along the XVI-XVI line in FIG. 15.

Next, the fourth preferred embodiment will be described. FIG. 15 is a side view of a chemical liquid supplying unit 7 according to a forth preferred embodiment of the present invention and its surroundings. FIG. 16 is a cross-sectional view taken along the XVI-XVI line in FIG. 15. In FIG. 15 and FIG. 16, the same reference numerals are given to the same members as those described so far, and the description thereof is omitted. In FIG. 15, for convenience of explanation, the illustration of the second chemical liquid nozzle 40 and the second chemical liquid pipe 41 are omitted.

The chemical liquid supplying unit 7 according to the fourth preferred embodiment includes a first chemical nozzle 90, which has a double tube structure which is configured of an inner tube 91 and an outer tube 92, instead of the first chemical liquid nozzle 30 and the first chemical liquid pipe 31 according to the first preferred embodiment. In the first chemical liquid nozzle 90, the first flow path 70 is defined by the inner tube 91, and the second flow path 80 is defined by the inner tube 91 and the outer tube 92.

The outer tube 92 includes a tube 93 which has one end part 93a on the opposite side of the pivoting axis A2 and the other end part 93b on the pivoting axis A2 side, and a wall part 94 which closes the on end part 93a of the tube 93. The first chemical liquid supplying tube 35 is connected to the other end part 93b of the tube 93. The outer tube 92 is supported by the holder 26 of the moving unit 8.

the inner tube 91 includes a tube 95 which defines the liquid storing part 71, a plurality of projecting pipes 96 which extends from the tube 95 to the outside of the outer tube 92, a defining wall 97 which defines the other end part 70b of the first flow path 70.

the projecting pipe 96 defines the discharge flow path 72 and is cranked so as to direct its tip downward. A plurality of first discharge ports 90a, which discharge the chemical liquid to the upper surface of the substrate W, is formed in the tip of each of the projecting pipe 96.

A gap 98 is provided between an upper part of the cylindrical tube 95 and the wall part 94. The second flow path 80 is turned back from the one end part 70a of the first flow path 70 via this gap 98.

When the chemical liquid supplying unit 7 is arranged at the process position, the plurality of the first discharge ports 90a face the upper surface of the substrate W. For detail, the first discharge ports 90a near the one end part 70a face the central region of the upper surface of the substrate W, and the first discharge ports 90a near the other end part 70b face the peripheral region of the upper surface of the substrate W.

A gap is not provided between a lower end of the outer tube 92 and a lower end of the inner tube 91 in the fourth preferred embodiment, but the gap may be provided the lower end of the outer tube 92 and the lower end of the inner tube 91 and this gap may configure a part of the second flow path 80.

According to the fourth preferred embodiment, as mentioned above, the first chemical liquid nozzle 90 has the double tube structure which is configured of the inner tube 91 and the outer tube 92. Furthermore, the first flow path 70 is defined by the inner tube 91 and the second flow path 80 is defined by the inner tube 91 and the outer tube 92. Therefore, the second flow path 80 can be placed at a position which is even closer to the first flow path 70. As a result, the chemical liquid in the first flow path 70 is more effectively kept warm by the chemical liquid in the second flow path 80. Furthermore, compared to the configuration having a tube which is turned back, miniaturization of the chemical liquid supplying unit 7 can be achieved.

Fifth Preferred Embodiment

Figure 17:
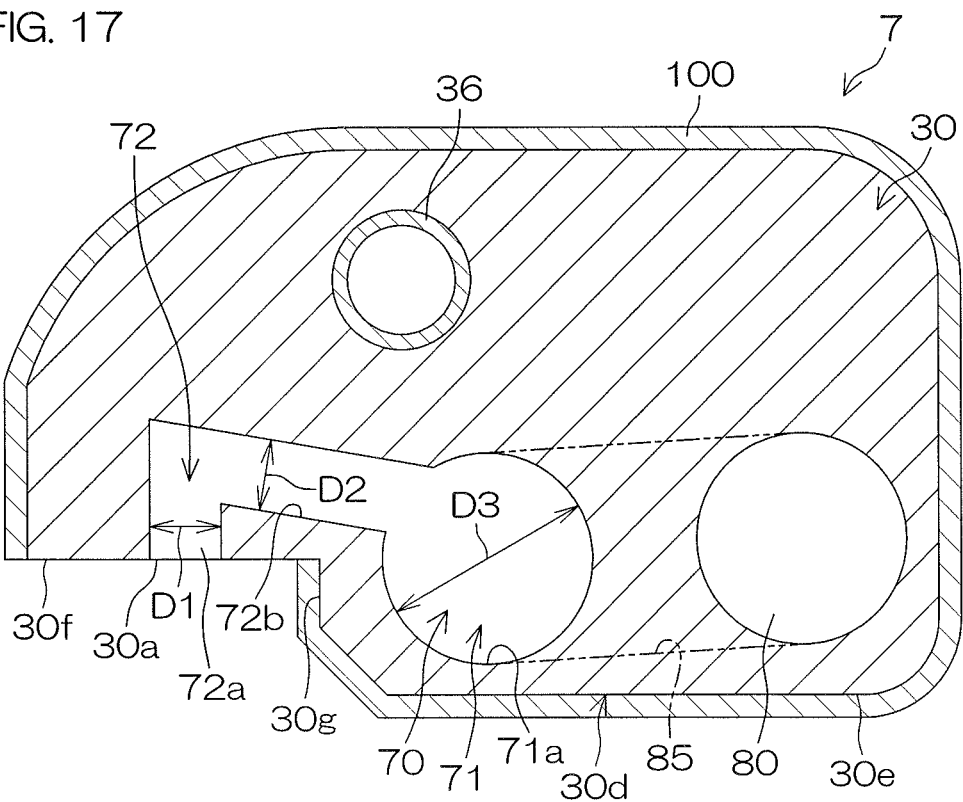
FIG. 17 is a cross-sectional view of a processing liquid nozzle according to a fifth preferred embodiment of the present invention.

Next, the fifth preferred embodiment of this invention will be explained. FIG. 17 is a cross-sectional view of the first chemical liquid nozzle 30 according to the fifth preferred embodiment of the present invention. In FIG. 17, the same reference numerals are given to the same members as those described so far, and the description thereof is omitted.

The chemical liquid supplying unit 7 according to the fifth preferred embodiment does not include the first chemical liquid pipe 31, and the second flow path 80 and the turning back flow path 85 are formed in the first chemical liquid nozzle 30 of the chemical liquid supplying unit 7 in addition to the first flow path 70. The turning back flow path 85 does not actually appear in the cross section shown in FIG. 17, it is indicated by a two-dot chain line. Therefore, the second flow path 80 can be positioned at a position even closer to the first flow path 70. As a result, the chemical liquid in the first flow path 70 is more efficiently kept warm by the chemical liquid in the second flow path 80. Furthermore, compared to the configuration (for example, the configuration of the first preferred embodiment) which has a pipe turned back, miniaturization of the chemical liquid supplying unit 7 can be achieved.

Furthermore, the chemical liquid supplying unit 7 according to the fifth preferred embodiment, further includes an insulating member 100 which surrounds the first chemical liquid nozzle 30 and insulates the first chemical liquid nozzle 30 from atmosphere around the first chemical liquid nozzle 30. Therefore, the chemical liquid in the first flow path 70 can be more effectively kept warm. The first chemical liquid nozzle 30 is preferably made of a material having relatively high heat conductivity such as a fluorine-based resin. Examples of the fluorine-based resin include PTFE (polytetrafluoroethylene) and the like. PE (polyethylene) or the like can be used as long as the temperature of the processing liquid is 100° C. or lower. The insulating member 100 does not necessarily cover the entire surface of the first chemical liquid nozzle 30.

The present invention is not limited to the embodiments described above, and can be implemented in still another embodiment.

For example, each embodiment described above can be arbitrarily combined. For example, the chemical liquid supplying units 7 according to the first preferred embodiment to the fourth preferred embodiment may include the insulating member 100.

Also, the configuration of the chemical liquid supplying unit 7 can be also applied to units which supply the processing liquid other than the chemical liquid (for example, rinse liquid).

Also, the second flow path 80 does not necessarily provided in parallel with the first flow path 70, and may extend obliquely with respect to the first flow path 70 or extend in a curved manner. Also, it is possible to adopt a configuration in which the turning back flow path 85 is not provided and the second flow path 80 may be connected to the first flow path 70 directly. Also, the first flow path 70 does not necessarily have to extend horizontally but may be inclined with respect to the horizontal direction such that the other end part 70b is positioned lower than the one end part 70a.

If so, the flow rate of the chemical liquid discharged from the first discharge ports 30a on the other end part 70b side of the first flow path 70 can be further increased more than the flow rate of the chemical liquid discharged from the first discharge ports 30a on the one end part 70a side of the first flow path 70.

Also, the moving unit 8 does not necessarily have to include the pivoting unit 27, and may include a ball screw mechanism which moves the chemical liquid supplying unit 7 linearly in the horizontal direction, and an electric motor which gives a driving force to the ball screw mechanism.

Also, in the substrate processing, the pre-dispense (S2) may be started before the carry-in of substrate (S1). By doing so, the time, during which is from the carrying of the substrate W to the start of supply of the chemical liquid to the upper surface of the substrate W, can be shortened.

Other than the features described in the claims, the following features can be extracted from this specification and the accompanying drawings. These features can be arbitrarily combined with the features described in the summary of the invention.

A1. A substrate processing apparatus comprising: a substrate holding unit which holds a substrate horizontally;

a processing liquid supplying unit which has a processing liquid nozzle discharging the processing liquid, and supplies a processing liquid to an upper surface of the substrate;

a moving unit which moves the processing liquid supplying unit between a process position at which the processing liquid nozzle faces the upper surface of the substrate and a retreat position at which the processing liquid nozzle retreats from positions at which the processing liquid nozzle faces the upper surface of the substrate, wherein the processing liquid supplying unit includes a plurality of discharge ports which are arranged along a direction in which the processing liquid nozzle extends, a first flow path which has a liquid storing part storing the processing liquid and discharge flow paths extending laterally from the liquid storing part and connecting each of the discharge port and the liquid storing part.

According to the invention described in A1, the processing liquid supplied to the first flow path is discharged from the discharge port via the liquid storing part and the discharge flow path in order. Therefore, by causing the processing liquid to be discharged from the discharge port in a state where the processing liquid supplying unit is moved to the process position, the processing can be landed on the upper surface of the substrate.

Here, when the processing liquid does not supplied to the first flow path, the processing liquid in the first flow path remains in the liquid storing part and the discharge flow path. The discharge flow path extends laterally from the liquid storing part, so that the processing liquid in the discharge flow path hardly bears the weight of the processing liquid in the liquid storing part. Compared to a configuration in which the discharge port is located lower than the liquid storing part, the processing liquid in the discharge flow path hardly bears the weight of the processing liquid in the liquid storing part. Unintentional falling of the processing liquid to the substrate from the processing liquid nozzle to the substrate can thus be suppressed, after the supply of the processing liquid is stopped.

A2. The substrate processing apparatus according to A1, wherein the first flow path is configured, such that one end part of the first flow path faces a central region of the substrate and the other end part of the first flow path faces a peripheral region of the substrate, in a state where the processing liquid supplying unit is positioned at the process position, and the processing liquid supplying unit further includes a second flow path which extends as turning back from the one end part and supplies the processing liquid to the one end part.

According to the invention described in A2, the processing liquid is supplied from the second flow path to the one end part of the first flow path. Furthermore, the plurality of the discharge ports are arranged along the direction in which the first flow path extends. Therefore, in the processing liquid nozzle, a flow rate of discharge ports which are positioned near the other part of the first flow path becomes larger than a flow rate of discharge ports which are positioned near the one part of the first flow path. In a state where the processing liquid supplying unit is positioned at the process position, the one end part of the first flow path faces the central region of the substrate and the other end part of the first flow path faces the peripheral region of the substrate. Therefore, a flow rate of the processing liquid which is supplied to the peripheral region of the upper side of the substrate can be increased more than a flow rate of the processing liquid which is supplied to the central region. Processing unevenness on the upper surface of the substrate can thus be reduced.

Furthermore, the second flow path which supplies the processing liquid to the one end part of the first flow path extends as turning back from the one end part, so that the first flow path and the second flow path can be arranged adjacent each other. Furthermore, the whole of the processing liquid supplying unit is moved by the moving unit, so that a state where the first flow path and the second flow path are adjacent to each other is maintained during the movement of the processing liquid supplying unit. Therefore, the temperature of the processing liquid in the first flow path can be maintained by the processing liquid in the second flow path. As a result, the temperature of the processing liquid which is discharged from the discharge ports and lands on the upper surface of the substrate can be maintained at a high temperature, so that the upper surface of the substrate can be processed with the processing liquid at the desired high temperature.

As described above, it is possible to process the upper surface of a substrate with the processing liquid at the desired high temperature and reduce processing unevenness on the upper surface of the substrate.

The present application corresponds to Japanese Patent Application No. 2017-099269 filed on May 18, 2017 in the Japan Patent Office, and the entire disclosure of the present application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing apparatus comprising:
a substrate holding unit which holds a substrate horizontally;
a processing liquid supplying unit which has a processing liquid nozzle discharging a processing liquid and supplies the processing liquid to an upper surface of the substrate; and
a moving unit which moves the processing liquid supplying unit between a process position at which the processing liquid nozzle faces the upper surface of the substrate and a retreat position at which the processing liquid nozzle retreats from positions at which the processing liquid nozzle faces the upper surface of the substrate,
wherein the processing liquid supplying unit includes
a first flow path which is formed in the processing liquid nozzle and extends in parallel with the upper surface of the substrate, the first flow path having one end part that faces a central region of the substrate and an other end part that faces a peripheral region of the substrate, in a state where the processing liquid supplying unit is positioned at the process position,
a second flow path which is located above the first flow path, extends so as to overlap the first flow path in a plan view, extends in parallel with the first flow path, and supplies the processing liquid to the one end part of the first flow path,
a turning back flow path which connects the one end part of the first flow path and the second flow path, and
a plurality of discharge ports which are formed in the processing liquid nozzle, are arranged along an extending direction in which the first flow path extends, and discharge the processing liquid in the first flow path to the upper surface of the substrate,
wherein the one end part of the first flow path is provided at an end part of the processing liquid nozzle in the extending direction,
the plurality of discharge ports face the upper surface of the substrate,
the first flow path is closed at the other end part of the first flow path,
the processing liquid supplying unit further includes a flow path forming pipe in which the second flow path is formed,
the flow path forming pipe is fixed with the processing liquid nozzle,
the processing liquid nozzle extends in parallel with the upper surface of the substrate,
the processing liquid supplying unit further includes a suction unit which sucks the processing liquid in the first flow path,
the suction unit includes a suction pipe which is branched from and connected to the flow path forming pipe at an intersecting portion at which the second flow path and the turning back flow path intersect and in which a suction flow path is formed,
the suction flow path is directly connected to the intersecting portion, and
the suction unit further includes a suction device which sucks an inside of the first flow path via the suction flow path.

2. The substrate processing apparatus according to claim 1, wherein the processing liquid nozzle includes a double tube structure which includes an inner tube and an outer tube, and
the first flow path is defined by the inner tube and the second flow path is defined between the inner tube and the outer tube.

3. The substrate processing apparatus according to claim 1, wherein the moving unit includes a pivoting unit which turns the processing liquid supplying unit around a pivoting axis along a vertical direction.

4. The substrate processing apparatus according to claim 1, wherein a pitch of the plurality of discharge ports is larger in a region corresponding to the one end part than in a region corresponding to the other end part.

5. The substrate processing apparatus according to claim 1, wherein the first flow path includes a liquid storing part which stores the processing liquid which is supplied from the second flow path, and a discharge flow path which extends laterally from the liquid storing part and is connected to each of the plurality of discharge ports and the liquid storing part.

6. The substrate processing apparatus according to claim 5, wherein the discharge flow path includes a vertical flow path which extends upwardly from one of the plurality of discharge ports, and an inclined flow path which connects the vertical flow path and the liquid storing part and is inclined with respect to a horizontal direction as the inclined flow path goes upwardly from the liquid storing part to the vertical flow path.

7. The substrate processing apparatus according to claim 5, wherein one of the plurality of discharge ports is located higher than a bottom part of the liquid storing part.

8. The substrate processing apparatus according to claim 5, wherein a flow path cross-sectional area of the discharge flow path is smaller than a flow path cross-sectional area of the liquid storing part.

9. The substrate processing apparatus according to claim 1, wherein the processing liquid supplying unit includes a heat insulating member which surrounds the processing liquid nozzle and insulates the processing liquid nozzle from atmosphere around the processing liquid nozzle.

10. The substrate processing apparatus according to claim 1, wherein a position of the second flow path with respect to the first flow path is fixed.

11. The substrate processing apparatus according to claim 1, wherein the moving unit includes a pivoting unit which turns the processing liquid supplying unit around a pivoting axis along a vertical direction, and
  the other end part of the first flow path is positioned closer to the pivoting axis than the one end part of the first flow path.

12. The substrate processing apparatus according to claim 1, further comprising:
  a second processing liquid nozzle which discharges the processing liquid and supplies the processing liquid to the upper surface of the substrate; and
  a side piping which is provided at a lateral position of the first flow path and the second flow path, and supplies the processing liquid to the second processing nozzle,
  wherein the side piping includes a horizontal part which extends in a horizontal direction, and a hanging part which extends from the horizontal part and inclines with respect to the horizontal direction such that a tip part of the hanging part is located lower than a base part of the hanging part, and
  the second processing liquid nozzle is connected to the tip part of the hanging part.

* * * * *